(12) United States Patent
Pickerd et al.

(10) Patent No.: US 12,328,242 B2
(45) Date of Patent: Jun. 10, 2025

(54) EYE CLASSES SEPARATOR WITH OVERLAY, AND COMPOSITE, AND DYNAMIC EYE-TRIGGER FOR HUMANS AND MACHINE LEARNING

(71) Applicant: Tektronix, Inc., Beaverton, OR (US)

(72) Inventors: John J. Pickerd, Hillsboro, OR (US); Kan Tan, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 403 days.

(21) Appl. No.: 17/592,437

(22) Filed: Feb. 3, 2022

(65) Prior Publication Data

US 2022/0247648 A1 Aug. 4, 2022

Related U.S. Application Data

(60) Provisional application No. 63/181,939, filed on Apr. 29, 2021, provisional application No. 63/145,433, filed on Feb. 3, 2021.

(51) Int. Cl.
*H04L 43/045* (2022.01)
*H04L 27/02* (2006.01)

(52) U.S. Cl.
CPC ............ *H04L 43/045* (2013.01); *H04L 27/02* (2013.01)

(58) Field of Classification Search
CPC ....... H04L 43/045; H04L 27/02; H04L 43/00; H04L 43/04; H04L 1/00; H04L 1/24; H04L 1/242; H04L 27/00; H04L 27/32; H04L 27/38; H04L 27/3809; H04L 27/14; H04L 27/156; H04L 27/1563; G01R 13/325;

(Continued)

(56) References Cited

U.S. PATENT DOCUMENTS 4,574,354 A * 3/1986 Mihalik ................ G06F 11/322
 714/E11.183
5,272,723 A * 12/1993 Kimoto ............. H04L 25/03165
 375/232

(Continued)

FOREIGN PATENT DOCUMENTS

CN 107342810 11/2019
EP 2743710 9/2018

(Continued)

OTHER PUBLICATIONS

European Patent Office, International Search Report and Written Opinion for International Application No. PCT/US2022/015151, May 12, 2022, 15 pages, Rijswijk, Netherlands.

(Continued)

*Primary Examiner* — James M Perez
(74) *Attorney, Agent, or Firm* — Miller Nash LLP; Andrew J. Harrington

(57) ABSTRACT

A system for generating images on a test and measurement device includes a first input for accepting a waveform input signal carrying sequential digital information and an image generator structured to generate a visual image using a segment of the waveform input only when two or more sequential codes of digital information match sequential codes carried in the sequential digital information of the segment of the waveform input. A user-defined state-machine comparator may be used to determine which segments of the waveform input signal are used in the image generation.

18 Claims, 16 Drawing Sheets

(58) Field of Classification Search
CPC ........ G01R 13/28; G01R 13/20; G01R 13/22; G01R 13/32

See application file for complete search history.

(56) References Cited

U.S. PATENT DOCUMENTS

| | | | | |
|---|---|---|---|---|
| 5,397,981 | A * | 3/1995 | Wiggers | G01R 13/345 324/121 R |
| 5,594,655 | A * | 1/1997 | Berchin | G01R 13/345 702/77 |
| 6,807,496 | B2 * | 10/2004 | Pickerd | G01R 13/28 702/67 |
| 7,181,146 | B1 * | 2/2007 | Yorks | H04B 10/0799 398/25 |
| 7,271,575 | B2 * | 9/2007 | Pickerd | G01R 13/22 324/76.19 |
| 7,298,463 | B2 * | 11/2007 | French | H04B 10/07 356/73.1 |
| 7,586,998 | B1 * | 9/2009 | Jones | H04L 25/063 375/348 |
| 8,583,395 | B2 * | 11/2013 | Dybsetter | H04B 10/40 702/119 |
| 8,861,578 | B1 * | 10/2014 | Lusted | H04B 17/104 375/353 |
| 8,982,938 | B2 * | 3/2015 | Ran | H04L 27/04 702/69 |
| 9,059,803 | B2 * | 6/2015 | Detofsky | H04B 10/40 |
| 9,130,751 | B2 * | 9/2015 | Zivny | H04L 43/087 |
| 9,136,952 | B2 * | 9/2015 | Schoen | H04L 27/06 |
| 9,337,993 | B1 * | 5/2016 | Lugthart | H04L 7/0087 |
| 9,344,203 | B2 * | 5/2016 | Ran | G01R 31/31709 |
| 9,548,858 | B1 * | 1/2017 | Cirit | H04L 7/0332 |
| 9,699,009 | B1 * | 7/2017 | Ainspan | H04L 25/49 |
| 9,709,605 | B2 * | 7/2017 | Alley | G01R 13/029 |
| 10,103,743 | B1 * | 10/2018 | Wang | H03M 1/007 |
| 10,171,161 | B1 * | 1/2019 | Côté | H04B 10/6161 |
| 10,209,276 | B2 * | 2/2019 | Tan | H04L 43/045 |
| 10,236,982 | B1 * | 3/2019 | Zhuge | H04B 10/073 |
| 10,270,527 | B1 * | 4/2019 | Mentovich | H04B 10/07955 |
| 10,396,897 | B1 * | 8/2019 | Malave | H04B 10/07955 |
| 10,447,510 | B1 * | 10/2019 | Rengarajan | H04L 25/03038 |
| 10,585,121 | B2 * | 3/2020 | Absher | G06N 7/01 |
| 10,727,973 | B1 * | 7/2020 | Kumar | H04L 45/70 |
| 10,852,323 | B2 * | 12/2020 | Schaefer | G01R 13/0245 |
| 10,863,255 | B2 * | 12/2020 | Zhang | H04J 14/0271 |
| 11,005,697 | B2 * | 5/2021 | Liston | H04L 27/261 |
| 11,040,169 | B2 * | 6/2021 | Jung | A61B 5/02055 |
| 11,095,314 | B2 * | 8/2021 | Medard | H03M 13/2906 |
| 11,095,425 | B2 * | 8/2021 | Duan | H04L 7/0037 |
| 11,177,986 | B1 * | 11/2021 | Ganesan | H04L 25/03878 |
| 11,233,561 | B1 * | 1/2022 | O'Shea | G06N 20/00 |
| 11,237,190 | B2 * | 2/2022 | Rule | G01R 13/325 |
| 11,336,378 | B2 * | 5/2022 | Bottoni | H04B 10/2581 |
| 11,374,800 | B1 * | 6/2022 | Hormati | H04L 25/03885 |
| 11,388,081 | B1 * | 7/2022 | Sommers | H04L 49/70 |
| 11,394,589 | B1 * | 7/2022 | Mayer | H04L 25/03878 |
| 11,476,967 | B2 * | 10/2022 | Geng | H04J 14/0242 |
| 11,496,282 | B1 * | 11/2022 | Hormati | H04L 25/4919 |
| 11,646,863 | B2 * | 5/2023 | Balan | H04L 7/0091 375/354 |
| 11,695,601 | B2 * | 7/2023 | Sudhakaran | H04L 27/02 375/295 |
| 11,722,341 | B2 * | 8/2023 | Hormati | H04L 25/03885 375/233 |
| 11,803,437 | B1 * | 10/2023 | Willey | G06F 11/076 |
| 12,146,914 | B2 * | 11/2024 | Agoston | G01R 31/31908 |
| 2002/0063553 | A1 * | 5/2002 | Jungerman | H04L 1/24 324/76.24 |
| 2003/0053170 | A1 * | 3/2003 | Levinson | H04B 10/6911 398/139 |
| 2003/0208330 | A1 * | 11/2003 | Pickerd | G01R 13/345 702/80 |
| 2003/0220753 | A1 * | 11/2003 | Pickerd | G01R 13/0254 702/67 |
| 2004/0027138 | A1 * | 2/2004 | Pickerd | G01R 13/22 324/76.19 |
| 2004/0032889 | A1 * | 2/2004 | Hidaka | H01S 5/0683 372/38.02 |
| 2004/0121733 | A1 * | 6/2004 | Peng | G01M 11/332 455/66.1 |
| 2004/0131365 | A1 * | 7/2004 | Lee | H04B 10/504 398/197 |
| 2004/0136422 | A1 * | 7/2004 | Mahowald | H04B 10/564 372/38.02 |
| 2004/0165622 | A1 * | 8/2004 | Lu | H04B 10/564 372/29.021 |
| 2004/0223544 | A1 * | 11/2004 | Upton | H04L 25/03019 375/233 |
| 2004/0236527 | A1 * | 11/2004 | Felps | G01R 13/0254 702/67 |
| 2005/0134306 | A1 * | 6/2005 | Stojanovic | H04L 25/4917 326/31 |
| 2005/0175079 | A1 * | 8/2005 | Gamper | G01R 13/0254 375/228 |
| 2005/0222789 | A1 * | 10/2005 | West | G11C 29/56 702/79 |
| 2005/0246601 | A1 * | 11/2005 | Waschura | H04L 1/20 714/724 |
| 2005/0249252 | A1 * | 11/2005 | Sanchez | H04B 10/564 372/38.07 |
| 2005/0281344 | A1 * | 12/2005 | Wall | H04Q 11/0071 375/259 |
| 2006/0120720 | A1 * | 6/2006 | Hauenschild | H04B 10/564 398/38 |
| 2008/0126001 | A1 * | 5/2008 | Murray | G01R 31/31915 702/185 |
| 2008/0159737 | A1 * | 7/2008 | Noble | H04B 10/0773 398/16 |
| 2008/0212979 | A1 * | 9/2008 | Ota | H04B 10/572 398/183 |
| 2009/0040335 | A1 * | 2/2009 | Ito | H04N 23/88 348/E9.051 |
| 2011/0085793 | A1 * | 4/2011 | Oomori | H04B 10/40 398/43 |
| 2011/0161738 | A1 * | 6/2011 | Zhang | H04B 10/58 714/E11.029 |
| 2011/0286506 | A1 * | 11/2011 | Libby | G01R 35/005 375/224 |
| 2012/0226727 | A1 * | 9/2012 | Zivny | H04L 43/045 708/290 |
| 2013/0046805 | A1 * | 2/2013 | Smith | G10L 25/00 708/404 |
| 2014/0093233 | A1 * | 4/2014 | Gao | H04B 10/0799 398/16 |
| 2014/0163914 | A1 * | 6/2014 | Alley | G01R 13/02 702/68 |
| 2014/0169429 | A1 * | 6/2014 | Ran | H04L 1/248 375/226 |
| 2014/0270030 | A1 * | 9/2014 | Hammad | H04L 7/0062 375/371 |
| 2014/0343883 | A1 * | 11/2014 | Libby | G01R 13/029 702/68 |
| 2015/0003505 | A1 * | 1/2015 | Lusted | H04L 25/03343 375/224 |
| 2015/0055694 | A1 * | 2/2015 | Juenemann | H04L 27/066 375/326 |
| 2015/0180592 | A1 * | 6/2015 | Ran | H04L 1/205 375/226 |
| 2015/0207574 | A1 * | 7/2015 | Schoen | G01R 31/3171 375/224 |
| 2015/0350042 | A1 * | 12/2015 | Zivny | H04L 43/087 375/226 |
| 2016/0191168 | A1 * | 6/2016 | Huang | H04J 14/0298 398/45 |
| 2016/0328501 | A1 * | 11/2016 | Chase | G06F 30/367 |
| 2017/0085366 | A1 * | 3/2017 | Poulo | H04L 7/08 |
| 2018/0006721 | A1 * | 1/2018 | Ishizaka | H04B 10/07955 |
| 2018/0045761 | A1 * | 2/2018 | Tan | G01R 13/029 |
| 2018/0074096 | A1 * | 3/2018 | Absher | G01R 23/16 |
| 2018/0204117 | A1 * | 7/2018 | Brevdo | G06N 20/00 |

(56) References Cited

U.S. PATENT DOCUMENTS

| | | | |
|---|---|---|---|
| 2018/0219636 A1* | 8/2018 | Gale | H04B 17/0085 |
| 2018/0241540 A1* | 8/2018 | Shibasaki | H03L 7/0807 |
| 2018/0278405 A1* | 9/2018 | Yao | H04L 7/0334 |
| 2018/0302264 A1* | 10/2018 | Liao | H04L 7/0062 |
| 2018/0356655 A1* | 12/2018 | Welch | H04B 10/50595 |
| 2019/0007141 A1* | 1/2019 | Kawata | H04B 10/505 |
| 2019/0038387 A1* | 2/2019 | Chu | C03C 10/0018 |
| 2019/0278500 A1* | 9/2019 | Lakshmi | G06F 3/0688 |
| 2019/0332941 A1* | 10/2019 | Towal | G06N 3/04 |
| 2019/0370158 A1* | 12/2019 | Rivoir | G06F 11/3672 |
| 2019/0370631 A1* | 12/2019 | Fais | G06N 3/04 |
| 2020/0035665 A1* | 1/2020 | Chuang | H01L 29/87 |
| 2020/0057824 A1* | 2/2020 | Yeh | G06F 30/13 |
| 2020/0145261 A1* | 5/2020 | Navid | H04L 25/03267 |
| 2020/0166546 A1* | 5/2020 | O'Brien | G01R 13/029 |
| 2020/0195353 A1* | 6/2020 | Ye | H04B 10/272 |
| 2020/0229206 A1* | 7/2020 | Badic | G05D 1/225 |
| 2020/0313999 A1* | 10/2020 | Lee | H04L 43/0847 |
| 2020/0335029 A1* | 10/2020 | Gao | H04B 10/2569 |
| 2021/0041499 A1* | 2/2021 | Ghosal | G06F 11/076 |
| 2021/0067312 A1* | 3/2021 | Kawasoe | H03L 7/091 |
| 2021/0105548 A1* | 4/2021 | Ye | H04Q 11/0005 |
| 2021/0111794 A1* | 4/2021 | Huang | H04B 10/2507 |
| 2021/0160109 A1* | 5/2021 | Seol | H04L 27/06 |
| 2021/0167864 A1* | 6/2021 | Razzell | H04B 10/25133 |
| 2021/0314081 A1* | 10/2021 | Shattil | G06N 5/027 |
| 2021/0389373 A1* | 12/2021 | Pickerd | G01R 31/31708 |
| 2021/0390456 A1* | 12/2021 | Pickerd | G01R 31/31708 |
| 2022/0070040 A1* | 3/2022 | Namgoong | G06N 3/088 |
| 2022/0076715 A1* | 3/2022 | Lee | G11C 7/1051 |
| 2022/0121388 A1* | 4/2022 | Woo | G06F 3/0604 |
| 2022/0182139 A1* | 6/2022 | Zhang | H04B 10/0799 |
| 2022/0182267 A1* | 6/2022 | Wang | H04L 7/0337 |
| 2022/0199126 A1* | 6/2022 | Lee | G11C 7/1057 |
| 2022/0200712 A1* | 6/2022 | Lillie | H04W 24/08 |
| 2022/0215865 A1* | 7/2022 | Woo | G11C 7/1006 |
| 2022/0236326 A1* | 7/2022 | Schaefer | G01R 13/029 |
| 2022/0239371 A1* | 7/2022 | Xu | G06N 3/08 |
| 2022/0247648 A1* | 8/2022 | Pickerd | H04L 1/242 |
| 2022/0311513 A1* | 9/2022 | Pickerd | H04B 10/40 |
| 2022/0311514 A1* | 9/2022 | Smith | H04B 10/0795 |
| 2022/0334180 A1* | 10/2022 | Pickerd | G01R 13/0254 |
| 2022/0360475 A1* | 11/2022 | Hormati | H03F 3/45201 |
| 2022/0373597 A1* | 11/2022 | Agoston | G01R 31/31908 |
| 2022/0373598 A1* | 11/2022 | Tan | G01R 31/31924 |
| 2022/0385374 A1* | 12/2022 | Arikawa | H04B 10/616 |
| 2022/0390515 A1* | 12/2022 | Pickerd | G01R 31/318307 |
| 2022/0393914 A1* | 12/2022 | Tan | H04L 25/03885 |
| 2022/0407595 A1* | 12/2022 | Varughese | H04B 10/0731 |
| 2023/0050162 A1* | 2/2023 | Tan | H04B 17/3912 |
| 2023/0050303 A1* | 2/2023 | Pickerd | G06F 11/27 |
| 2023/0052588 A1* | 2/2023 | Sudhakaran | H04L 27/02 |
| 2023/0088409 A1* | 3/2023 | Parsons | H04B 10/0731 |
| | | | 356/73.1 |
| 2023/0098379 A1* | 3/2023 | Smith | G06N 3/045 |
| | | | 706/12 |
| 2023/0194599 A1* | 6/2023 | Gilabert | G06F 21/44 |
| | | | 324/762.02 |
| 2023/0228803 A1* | 7/2023 | Sun | G01R 31/2603 |
| | | | 324/537 |
| 2023/0236996 A1* | 7/2023 | Saraswat | G06T 1/60 |
| 2023/0239182 A1* | 7/2023 | Ikeda | H04B 3/04 |
| | | | 375/229 |
| 2023/0299862 A1* | 9/2023 | O'Shea | H04L 5/0048 |
| | | | 370/252 |
| 2023/0306578 A1* | 9/2023 | Pickerd | G06V 10/82 |
| 2024/0073081 A1* | 2/2024 | Yang | H04L 25/028 |

FOREIGN PATENT DOCUMENTS

| | | |
|---|---|---|
| EP | 3936877 | 1/2022 |
| JP | 6560793 | 8/2019 |
| WO | 2021092156 | 5/2021 |
| WO | 2022171645 | 8/2022 |
| WO | 2022189613 | 9/2022 |

OTHER PUBLICATIONS

Varughese, Siddarth, et al., Accelerating Assessments of Optical Components Using Machine Learning: TDECQ as Demonstrated Example, Journal of Lightwave Technology, Jan. 1, 2021, pp. 64-72, vol. 39, No. 1, IEEE.

Varughese, Siddarth, et al., Accelerating TDECQ Assessments using Convolutional Neural Networks, OFC, Mar. 2020, 3 pages, The Optical Society (OSA).

Watts et al., "Performance of Single-Mode Fiber Links Using Electronic Feed-Forward and Decision Feedback Equalizers", 2005, IEEE Photonics Techology Letters, vol. 17, No. 10, pp. 2206-2208 (Year: 2005).

Echeverri-Chacon et al., "Transmitter and Dispersion Eye Closure Quaternary (TDECQ) and Its Sensitivity to Impairments in PAM4 Waveforms", 2019, Journal of Lightwave Technology, vol. 37, No. 3, pp. 852-860 (Year: 2019).

Wang et al., "Intelligent Constellation Diagram Analyzer Using Convolutional Neural Network-Based Deep Learning," Optics Express, Jul. 24, 2017, vol. 25, No. 15.

* cited by examiner

COMBINATIONS OF SEPARATED EYE COMPONENT TYPES

COMPOSITE EYE DIAGRAMS

COMPOSITE EYE DIAGRAMS

| | INPUT STATES | | | | | | OUTPUT COMPONENT DIAGRAMS | | | | | | |
|---|---|---|---|---|---|---|---|---|---|---|---|---|---|
| | B1 | B2 | B3 | B4 | B5 | B6 | A | B | C | D | E | F | G |
| 1 | 0 | 0 | 0 | 0 | 0 | 0 | 1 | 0 | 0 | 1 | 0 | 1 | 1 |
| 2 | 0 | 0 | 0 | 0 | 0 | 1 | 1 | 0 | 0 | 0 | 0 | 0 | 0 |
| 3 | 0 | 0 | 0 | 0 | 1 | 0 | 0 | 0 | 0 | 0 | 0 | 1 | 0 |
| 4 | 0 | 0 | 0 | 0 | 1 | 1 | 0 | 0 | 0 | 1 | 0 | 0 | 0 |
| 5 | 0 | 0 | 0 | 1 | 0 | 0 | 1 | 0 | 0 | 0 | 0 | 0 | 0 |
| 6 | 0 | 0 | 0 | 1 | 0 | 1 | 1 | 0 | 0 | 0 | 0 | 0 | 0 |
| 7 | 0 | 0 | 0 | 1 | 1 | 0 | 0 | 0 | 0 | 0 | 0 | 0 | 0 |
| 8 | 0 | 0 | 0 | 1 | 1 | 1 | 0 | 0 | 0 | 0 | 0 | 0 | 0 |
| 9 | 0 | 0 | 1 | 0 | 0 | 0 | 0 | 0 | 0 | 0 | 0 | 1 | 0 |
| 10 | 0 | 0 | 1 | 0 | 0 | 1 | 0 | 0 | 0 | 0 | 0 | 0 | 0 |
| 11 | 0 | 0 | 1 | 0 | 1 | 0 | 0 | 0 | 0 | 0 | 0 | 1 | 0 |
| 12 | 0 | 0 | 1 | 0 | 1 | 1 | 0 | 0 | 0 | 0 | 0 | 0 | 0 |
| 13 | 0 | 0 | 1 | 1 | 0 | 0 | 0 | 0 | 0 | 1 | 0 | 0 | 0 |
| 14 | 0 | 0 | 1 | 1 | 0 | 1 | 0 | 0 | 0 | 0 | 0 | 0 | 0 |
| 15 | 0 | 0 | 1 | 1 | 1 | 0 | 0 | 0 | 0 | 0 | 0 | 0 | 0 |
| 16 | 0 | 0 | 1 | 1 | 1 | 1 | 0 | 0 | 0 | 1 | 0 | 0 | 0 |
| 17 | 0 | 1 | 0 | 0 | 0 | 0 | 1 | 0 | 0 | 0 | 0 | 0 | 0 |
| 18 | 0 | 1 | 0 | 0 | 0 | 1 | 1 | 0 | 0 | 0 | 0 | 0 | 0 |
| 19 | 0 | 1 | 0 | 0 | 1 | 0 | 0 | 0 | 0 | 0 | 0 | 0 | 0 |
| 20 | 0 | 1 | 0 | 0 | 1 | 1 | 0 | 0 | 0 | 0 | 0 | 0 | 0 |
| 21 | 0 | 1 | 0 | 1 | 0 | 0 | 1 | 0 | 0 | 0 | 0 | 0 | 0 |
| 22 | 0 | 1 | 0 | 1 | 0 | 1 | 1 | 1 | 0 | 0 | 1 | 0 | 1 |
| 23 | 0 | 1 | 0 | 1 | 1 | 0 | 0 | 0 | 0 | 0 | 1 | 0 | 0 |
| 24 | 0 | 1 | 0 | 1 | 1 | 1 | 0 | 1 | 0 | 0 | 0 | 0 | 0 |
| 25 | 0 | 1 | 1 | 0 | 0 | 0 | 0 | 0 | 0 | 0 | 0 | 0 | 0 |
| 26 | 0 | 1 | 1 | 0 | 0 | 1 | 0 | 0 | 0 | 0 | 1 | 0 | 0 |
| 27 | 0 | 1 | 1 | 0 | 1 | 0 | 0 | 0 | 0 | 0 | 1 | 0 | 0 |
| 28 | 0 | 1 | 1 | 0 | 1 | 1 | 0 | 0 | 0 | 0 | 0 | 0 | 0 |
| 29 | 0 | 1 | 1 | 1 | 0 | 0 | 0 | 0 | 0 | 0 | 0 | 0 | 0 |
| 30 | 0 | 1 | 1 | 1 | 0 | 1 | 0 | 1 | 0 | 0 | 0 | 0 | 0 |
| 31 | 0 | 1 | 1 | 1 | 1 | 0 | 0 | 0 | 0 | 0 | 0 | 0 | 0 |
| 32 | 0 | 1 | 1 | 1 | 1 | 1 | 0 | 1 | 0 | 0 | 0 | 0 | 0 |
| 33 | 1 | 0 | 0 | 0 | 0 | 0 | 0 | 0 | 0 | 0 | 0 | 1 | 0 |
| 34 | 1 | 0 | 0 | 0 | 0 | 1 | 0 | 0 | 0 | 0 | 0 | 0 | 0 |
| 35 | 1 | 0 | 0 | 0 | 1 | 0 | 0 | 0 | 0 | 0 | 0 | 1 | 0 |
| 36 | 1 | 0 | 0 | 0 | 1 | 1 | 0 | 0 | 0 | 0 | 0 | 0 | 0 |
| 37 | 1 | 0 | 0 | 1 | 0 | 0 | 0 | 0 | 0 | 0 | 0 | 0 | 0 |
| 38 | 1 | 0 | 0 | 1 | 0 | 1 | 0 | 0 | 0 | 0 | 1 | 0 | 0 |
| 39 | 1 | 0 | 0 | 1 | 1 | 0 | 0 | 0 | 0 | 0 | 1 | 0 | 0 |
| 40 | 1 | 0 | 0 | 1 | 1 | 1 | 0 | 0 | 0 | 0 | 0 | 0 | 0 |
| 41 | 1 | 0 | 1 | 0 | 0 | 0 | 0 | 0 | 0 | 0 | 0 | 1 | 0 |
| 42 | 1 | 0 | 1 | 0 | 0 | 1 | 0 | 0 | 0 | 0 | 1 | 0 | 0 |
| 43 | 1 | 0 | 1 | 0 | 1 | 0 | 0 | 0 | 1 | 0 | 1 | 1 | 1 |
| 44 | 1 | 0 | 1 | 0 | 1 | 1 | 0 | 0 | 1 | 0 | 0 | 0 | 0 |
| 45 | 1 | 0 | 1 | 1 | 0 | 0 | 0 | 0 | 0 | 0 | 0 | 0 | 0 |
| 46 | 1 | 0 | 1 | 1 | 0 | 1 | 0 | 0 | 0 | 0 | 0 | 0 | 0 |
| 47 | 1 | 0 | 1 | 1 | 1 | 0 | 0 | 0 | 1 | 0 | 0 | 0 | 0 |
| 48 | 1 | 0 | 1 | 1 | 1 | 1 | 0 | 0 | 1 | 0 | 0 | 0 | 0 |
| 49 | 1 | 1 | 0 | 0 | 0 | 0 | 0 | 0 | 0 | 1 | 0 | 0 | 0 |
| 50 | 1 | 1 | 0 | 0 | 0 | 1 | 0 | 0 | 0 | 0 | 0 | 0 | 0 |
| 51 | 1 | 1 | 0 | 0 | 1 | 0 | 0 | 0 | 0 | 0 | 0 | 0 | 0 |
| 52 | 1 | 1 | 0 | 0 | 1 | 1 | 0 | 0 | 0 | 1 | 0 | 0 | 0 |
| 53 | 1 | 1 | 0 | 1 | 0 | 0 | 0 | 0 | 0 | 0 | 0 | 0 | 0 |
| 54 | 1 | 1 | 0 | 1 | 0 | 1 | 0 | 1 | 0 | 0 | 0 | 0 | 0 |
| 55 | 1 | 1 | 0 | 1 | 1 | 0 | 0 | 0 | 0 | 0 | 0 | 0 | 0 |
| 56 | 1 | 1 | 0 | 1 | 1 | 1 | 0 | 1 | 0 | 0 | 0 | 0 | 0 |
| 57 | 1 | 1 | 0 | 0 | 0 | 0 | 0 | 0 | 0 | 0 | 0 | 0 | 0 |
| 58 | 1 | 1 | 1 | 0 | 0 | 1 | 0 | 0 | 0 | 0 | 0 | 0 | 0 |
| 59 | 1 | 1 | 1 | 0 | 1 | 0 | 0 | 0 | 1 | 0 | 0 | 0 | 0 |
| 60 | 1 | 1 | 1 | 0 | 1 | 1 | 0 | 1 | 0 | 0 | 0 | 0 | 0 |
| 61 | 1 | 1 | 1 | 1 | 0 | 0 | 0 | 0 | 0 | 1 | 0 | 0 | 0 |
| 62 | 1 | 1 | 1 | 1 | 0 | 1 | 0 | 1 | 0 | 0 | 0 | 0 | 0 |
| 63 | 1 | 1 | 1 | 1 | 1 | 0 | 0 | 0 | 1 | 0 | 0 | 0 | 0 |
| 64 | 1 | 1 | 1 | 1 | 1 | 1 | 0 | 1 | 1 | 1 | 0 | 0 | 1 |

FIG. 11

EYE CLASSES SEPARATOR WITH OVERLAY, AND COMPOSITE, AND DYNAMIC EYE-TRIGGER FOR HUMANS AND MACHINE LEARNING

CROSS-REFERENCE TO RELATED APPLICATIONS

This disclosure is a non-provisional of and claims benefit from U.S. Provisional Patent Application 63/145,433, titled "EYE CLASSES SEPARATOR WITH OVERLAY, AND COMPOSITE, AND DYNAMIC EYE-TRIGGER FOR HUMANS AND MACHINE LEARNING," filed Feb. 3, 2021, and U.S. Provisional Patent Application No. 63/181,939, titled "EYE CLASSES SEPARATOR WITH OVERLAY, AND COMPOSITE, AND DYNAMIC EYE-TRIGGER, AND TENSOR IMAGES FOR HUMANS AND MACHINE LEARNING," filed Apr. 29, 2021, the disclosures of both of which are incorporated herein by reference in their entirety.

TECHNICAL FIELD

This disclosure relates to test and measurement instruments and systems, and more particularly to test and measurement instruments including improved serial data signal analysis and visualization techniques.

BACKGROUND

Eye diagrams generated by test and measurement equipment provide a straightforward testing and measuring system for analyzing analog test signals that carry digital information. Specifically, eye diagrams representing incoming signals allow a user to visualize qualities of the signal, such as amplitude levels of logical zero, amplitude levels of logical one, rise time, fall time, height, eye width, deterministic jitter, eye amplitude, and bit rate, among others. Eye diagrams of PAM2 signals, which are Phase Amplitude Modulated signals, include two amplitude levels, while eye diagrams of PAM 3 or PAM4 signals include three or four amplitude levels, respectively.

As the number of PAM amplitude levels increases, the complexity of the eye diagrams increases as well, and it becomes harder for a user to accurately analyze a multi-level PAM signal, or other multi-level signal, using an eye diagram.

Embodiments of the invention address these and other shortcomings of visualizations of multi-level signals.

BRIEF DESCRIPTION OF THE DRAWINGS

FIG. 11 is a state-diagram truth table illustrating a three sequential stage system of input data and associated output data to generate images for an image database, according to embodiments.

DESCRIPTION

Figure 1:
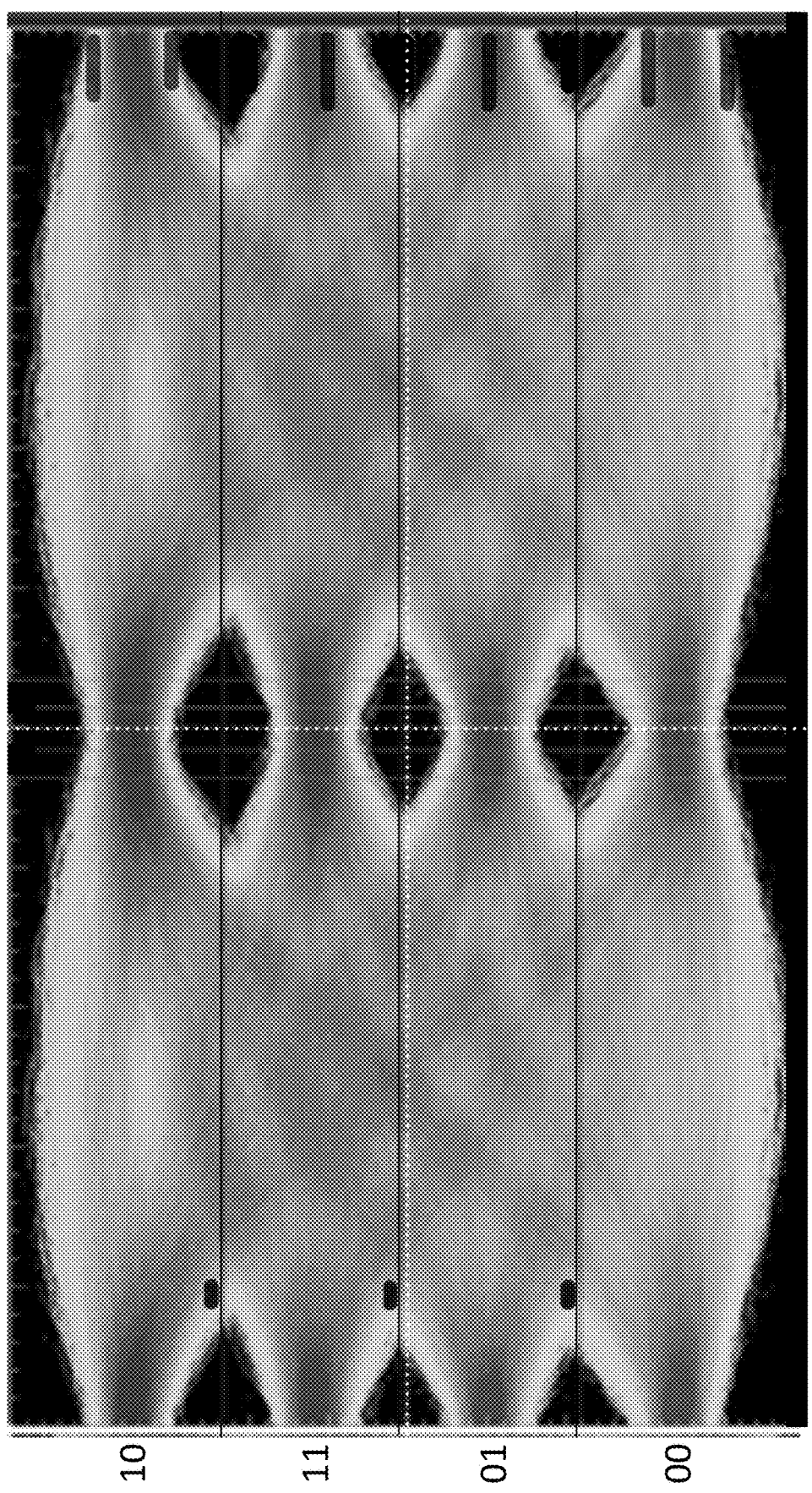
FIG. 1 is a view of a conventional Eye Diagram for a PAM4 signal.
Figure 2:
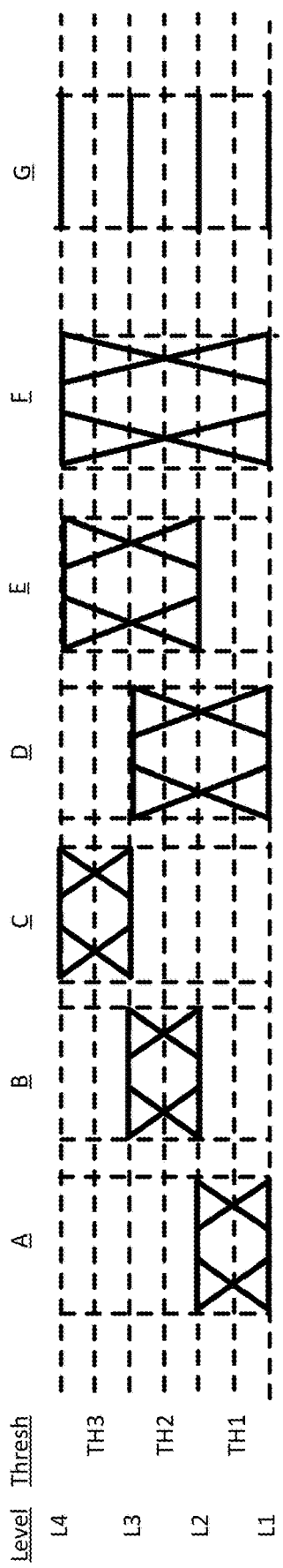
FIGS. 2, 3, 4, and 5 are diagrams illustrating how components of an eye diagram for a PAM4 signal may be separately categorized, according to embodiments of the invention.

Although this description is presented with reference primarily to an eye diagram for a PAM4 signal, embodiments of the invention are operative with any type of eye diagram. FIG. 1 is a view of a conventional eye diagram produced from a PAM4 signal. In general, eye diagrams illustrate two Unit Intervals (UI) of the signal, i.e., twice the time specified for the signal to switch from a starting level to a second level. The actual duration for the UI transitions is dependent on the rate at which the signal changes, i.e., the baud rate or frequency of the input signal. In general, the eye diagram in FIG. 2 is a voltage versus time diagram that illustrates voltage amplitude levels of the input signal over time. The input signal carries digitally coded information, and the amplitude of the input signal generally lands, on each unit interval, at one of the levels of amplitude indicative of the digitally coded information carried by the input signal. An input signal that is not within a tolerance level of the desired amplitude level at the beginning or end of each UI is out of specification. The eye diagram, such as the one illustrated in FIG. 1, is composed of a large number of two-UI durations of the input signal, each 'stacked' on one another as the desired number of UIs of the input signal are graphed. The eye diagram highlights areas that are more often traversed by the input signal to distinguish these highlighted areas from areas that are not often received by the input signal. The highlights are generally colored areas, but shading may be used as well. Areas of the eye diagram that are rarely or never detected in the input signal may appear as 'eyes' in the diagram, such as the three eyes seen in the center portion of FIG. 1. Thus, visual inspection of an eye diagram allows a user to very quickly determine typical paths of the input signal transitions, and whether, or to what extent, the input signal is within specifications.

Clearly seen in FIG. 1 are four distinct amplitude levels, at the beginning and end of each of the two UIs illustrated.

In the illustrated embodiment, the incoming signal is a PAM4 signal coded in Gray code, and the four amplitude levels correspond to the digital codes carried on the input signal and received by the measurement instrument. From the lowest to the top, the digital codes are 00, 01, 11, and 10, which correspond to the four pre-defined amplitude levels in the input signal. In this disclosure, the input signal may be referred to by either amplitude levels or the digital codes the amplitude signals represent. Embodiments of the invention work with any type of coding, and any number of coded levels.

In the typical 2-UI eye diagram of the PAM4 signal, the input signal is at or near one of four amplitude levels (00, 01, 11, or 10) at the beginning of the interval, at or near one of the four amplitude levels at the end of the first UI, and at or near one of the four amplitude levels at the end of the second UI. This means that there are $4^3$ ($4*4*4=64$) different possible combinations, in three, sequential, two-bit digital codes carried by the input signal. By comparison, a PAM2 signal includes $2^3$ ($2*2*2=8$) different possible combinations, and a PAM3 signal includes $3^3$ ($3*3*3=27$) different possible combinations. Each of the possible combinations is expressed in an eye diagram of the PAMn signal as an individual path that begins at one of the defined levels in the eye diagram (e.g., four levels in the case of PAM4, three levels in the case of PAM3, and two levels in the case of PAM2), traverses to another of the defined levels in the middle of the eye diagram, and traverses to another of the defined levels at the end of the eye diagram. Therefore, the eye diagram of a randomly generated PAM signal can be quite detailed and somewhat difficult to evaluate due to its cluttered appearance. This is especially true for eye diagrams of PAM3 and PAM4 signals, which include 27 or 64 different combinations, or signal paths through the eye diagram, respectively. As described below, embodiments of the invention provide a new ability for users to visualize input signals, including PAMn signals having more than 4 levels.

In general, a PAM4 signal can be constructed by first creating two PAM2 NRZ (Non-Return to Zero) signals and then summing them together with a power combiner. Thus, the PAM4 signal results in transition edges that all have essentially the same rise time from 10% to 90% of the edge transition. This means that the dV/dt slew rate is different depending on the number of levels the PAM4 signal is changing in its next state. For example, with reference to FIG. 1, for the first UI, the slope of the trace changing from Level 1 (00) to Level 2 (01) is less steep than the slope of the trace changing from Level 1 (00) to Level 4 (10), because the slope depends on the number of levels changed during the transition. The slope is greater for the three-level transition edges (e.g. from Level 1 to Level 4), than it is for two-level transition edges (e.g. from Level 1 to Level 3), and it is even less for one-level transition edges (e.g. from Level 1 to Level 2).

FIG. 2 is a diagram illustrating how components of an eye diagram that illustrates a PAM4 signal may be separately categorized, according to embodiments of the invention. Embodiments of the invention allow the user to select particular, separated, components of the PAMn eye diagram for viewing, rather than viewing all possible components in the typical eye diagram. In some embodiments, the user may select only a single particular component type for viewing, while in other embodiments the user may select multiple component types for viewing. Also, as described above, embodiments of the invention are not limited to PAM4 eye diagrams, but may be used with any type of eye diagram that is separable into component parts. Being able to generate an image diagram for only a subset of the incoming PAMn signal increases in importance as the number of PAM levels increases, from PAM2, PAM3, PAM4, PAM8, or any additional defined levels.

Referring back to FIG. 2, seven different categorizations of components of a PAM4 diagram are illustrated as different eye "types", A-G. Eye types A, B, and C contain only edges that cover a single level transition. More specifically, eye type A covers transitions between L1 and L2 (i.e., from L1 to L2 and from L2 to L1), eye type B covers transitions between L2 and L3, and eye type C covers transitions between L3 and L4. Next, eye types D and E cover two-level transitions. Eye type D covers transitions between L1 and L3, while eye type E covers transitions between L2 and L4. Eye type F contains edges that cover only three-level transitions, i.e., between L1 and L4. Finally, eye type G contains intervals that have no transitions. In other words, eye type G illustrates situations where the input signal does not change from one UI to the next. Eye type G is valuable when measuring noise at the different levels independent of the inter-symbol interference (ISI) of the system.

Embodiments of the invention allow the user to select individual or groups of the particular components of the eye diagram to be displayed on a display of a test device, and then the instrument generates the image of only the selected components. For instance, the user may determine that he or she wishes only to see single level transitions, and instructs the test device to create an eye diagram or image for transitions in the input signal that have the properties described by eye component types A, B, and C. Then the testing device analyzes the input signal and generates an image or eye diagram that only includes the desired, single-level transition components of the typical PAM4 eye diagram, but specifically does not include any two-level or three-level transitions. In this manner that new diagram is much less cluttered and allows the user to evaluate only those transitions, or components, of interest. In some embodiments the testing device may operate on a stored input signal or in other embodiments the testing device may generate the image or eye diagram in real or near-real time.

Figure 3:
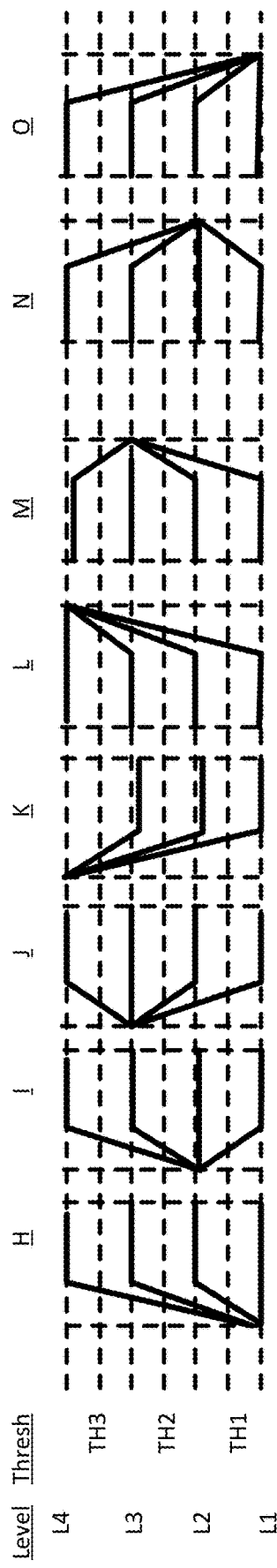
Figure 4:
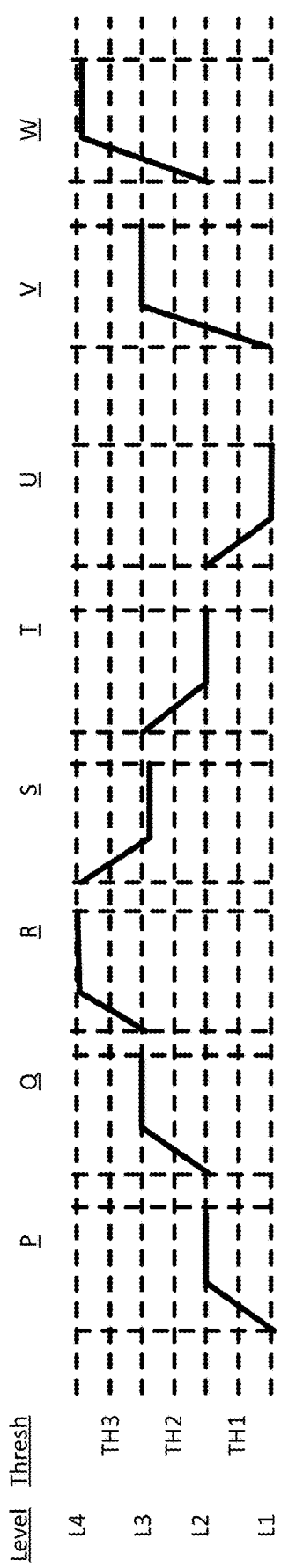
Figure 5:
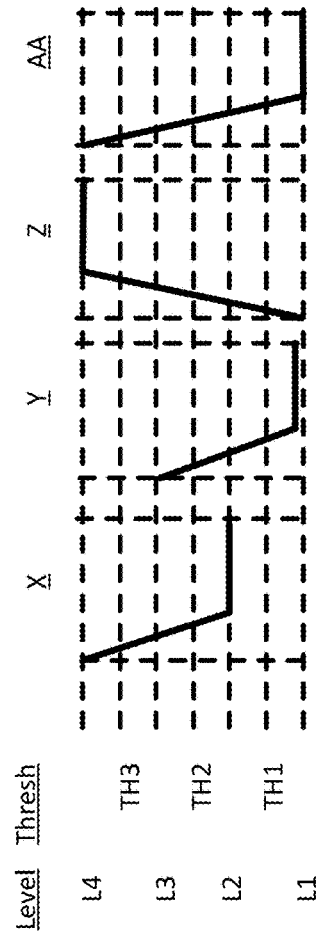

Whereas FIG. 2 illustrates eye type components characterized based on two-UI behavior, FIGS. 3, 4 and 5 identify additional eye types that correspond to a single transition, as described in Table 1.

TABLE 1

| Eye Component Type | Eye Diagram component description |
|---|---|
| H | Begins at L1 |
| I | Begins at L2 |
| J | Begins at L3 |
| K | Begins at L4 |
| L | Ends at L4 |
| M | Ends at L3 |
| N | Ends at L2 |
| O | Ends at L1 |
| P | Begins at L1, ends at L2 |
| Q | Begins at L2, ends at L3 |
| R | Begins at L3, ends at L4 |
| S | Begins at L4, ends at L3 |
| T | Begins at L3, ends at L2 |
| U | Begins at L2, ends at L1 |
| V | Begins at L1, ends at L3 |
| W | Begins at L2, ends at L4 |
| X | Begins at L4, ends at L2 |
| Y | Begins at L3, ends at L1 |
| Z | Begins at L1, ends at L4 |
| AA | Begins at L4, ends at L1 |

The separated eye component types illustrated in FIGS. 3-5 may be particularly useful for a user in terms of evaluating step responses of the various transitions. These views may also be useful for machine learning applications, such as read versus write separation, where the transfer function of each operation is different.

Note that eye component types H—O define or illustrate multiple possible transitions. For instance, eye component type H is a combination of eye component types P, V, and Z. Using these combinations, a user may select any transition of a signal beginning at Level 1 by selecting eye component type H. Or, a user may select only those particular transitions beginning at Level 1 and ending at Level 3 by selecting eye component type V.

Although separated eye component types A-AA are illustrated in FIGS. 2-5, embodiments of the invention allow any input signal transition, or combination of transitions, to be defined as a separated eye component type. For example, the user could be interested in viewing a diagram of transitions in the input signal that begin at Level 2, transition to Level 4, and then transition to Level 1. In this case the user selects eye component types W and AA to be generated in the diagram. In another example, the user could be interested in viewing a diagram of transitions in the input signal that begin at any Level, transition to Level 4, and then transition to Level 1. In this case the user selects eye component types L and AA to be generated in the diagram.

Embodiments of the invention are not limited to generating images of separated eye component types, but can also generate new types of images for analysis of input signals. For instance, with reference to FIGS. 6A, 6B, and 6C, groups of separated eye component types may be combined in a single display, which may be called an overlay display. Overlay displays may be formed by overlaying two or more of the separated eye component types described above.

Figure 6A:
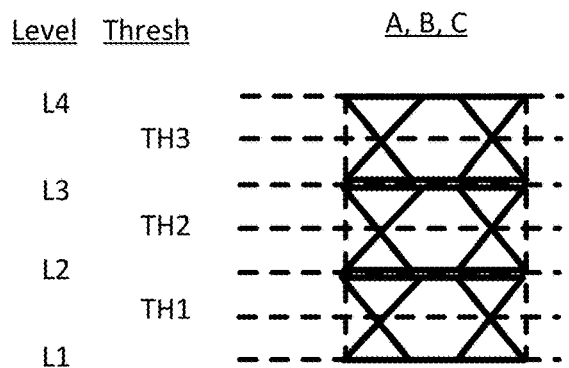
FIGS. 6A, 6B, and 6C are diagrams illustrating potential image layouts of overlayed, separated, component types of an eye diagram according to embodiments of the invention.
Figure 7A:
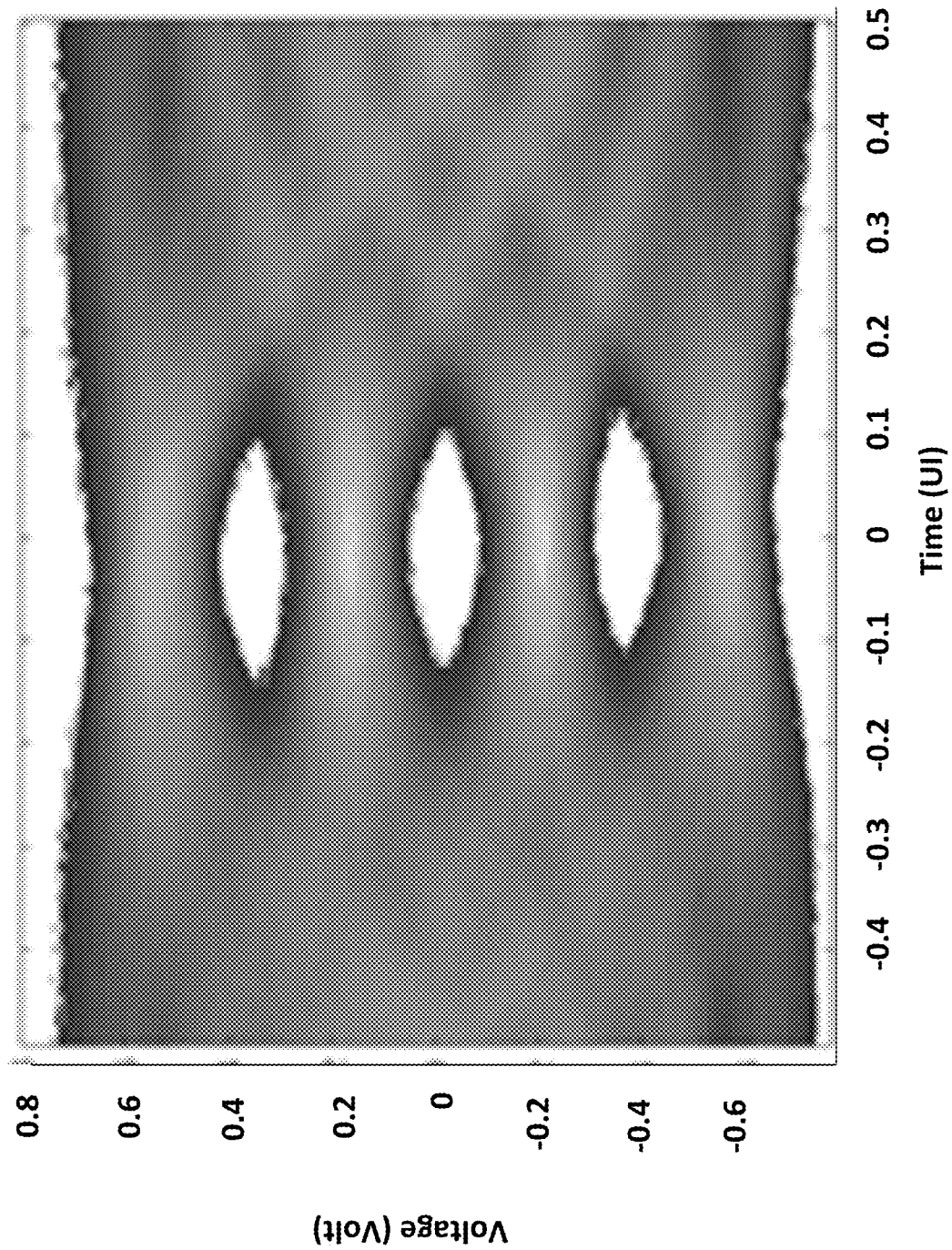
FIG. 7A is an image of a conventional eye diagram of a PAM4 signal.
Figure 7B:
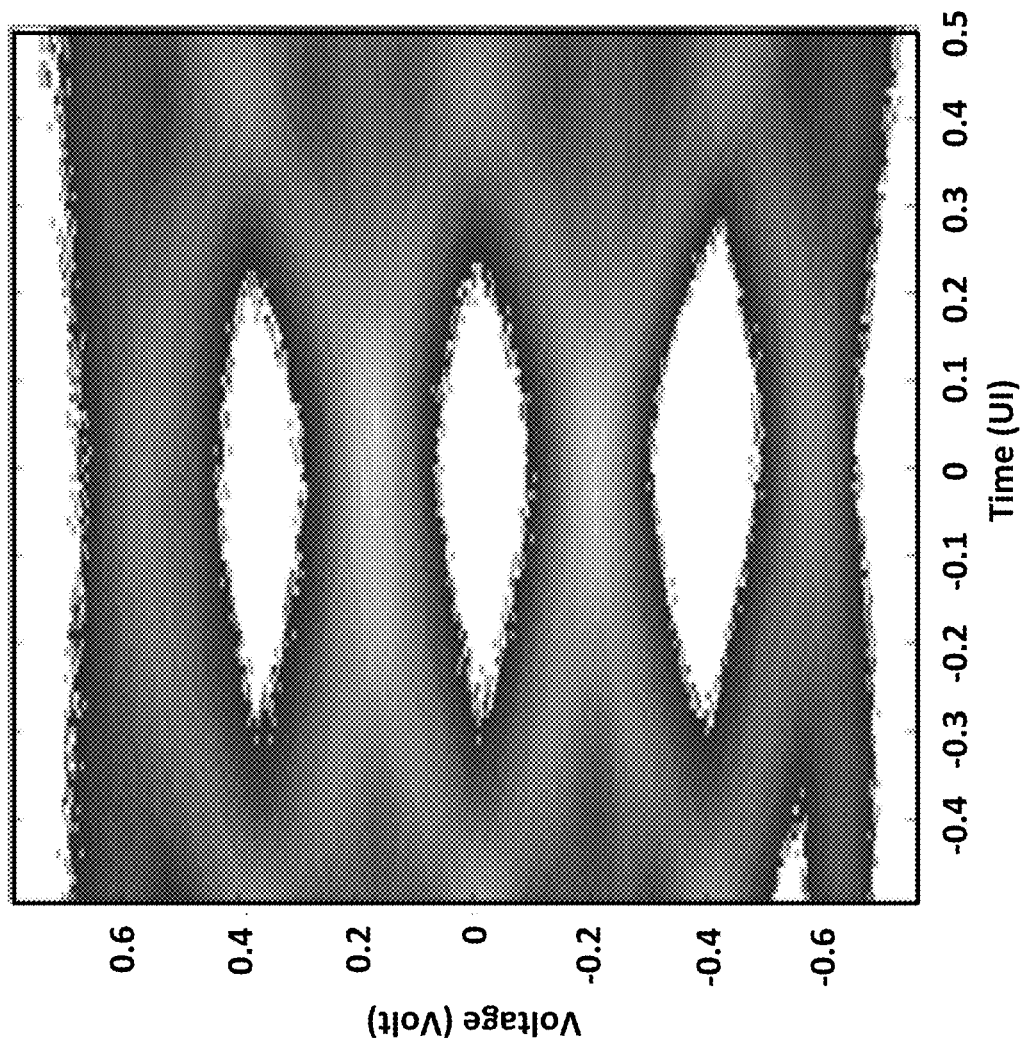
FIG. 7BA is an image of an overlay diagram generated by superimposing three separated subcomponent types of eye diagrams into a single image, according to embodiments of the invention.

A first overlay diagram is illustrated in FIG. 6A, which is created by overlaying three, single-level, transitions for the same UIs. In other words, with reference back to FIG. 2, the overlay illustrated in FIG. 6A is formed by combining the separated eye component types A, B, and C into a single, 2-UI wide display. Comparing FIGS. 7A and 7B illustrate how embodiments of the invention provide clearer diagrams for analysis than conventional eye diagrams. FIG. 7A is an image of a conventional, one-UI eye diagram of a PRBS (Psuedo-Random Binary Sequence) PAM4 signal, while FIG. 7BA is an image of an overlay diagram generated by superimposing three separated subcomponent types of one-UI eye diagrams into a single image, according to embodiments of the invention. Compared to the standard eye diagram for a PAM4 signal illustrated in FIG. 7A, the overlay diagram of FIG. 7B includes much larger eye openings, since only single transition levels are used to generate the overlay display of FIG. 7B. These larger eye openings may make it easier for a user to identify potential problems with the device sending the input signal, e.g., a device under test (DUT). This separated and overlaid view of FIG. 7B is particularly helpful for PAM4 transmitter parameter tuning, to optimize the signal for the smallest Symbol Error Rate (SER), which is often analyzed with the help of eye diagrams. Using an overlay diagram such as described in FIG. 6A, a user may analyze and tune the delay and gain of the two NRZ components of a PAM4 signal.

Figure 6B:
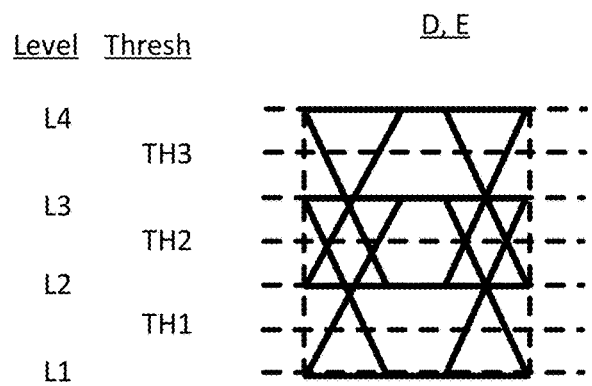
Figure 6C:
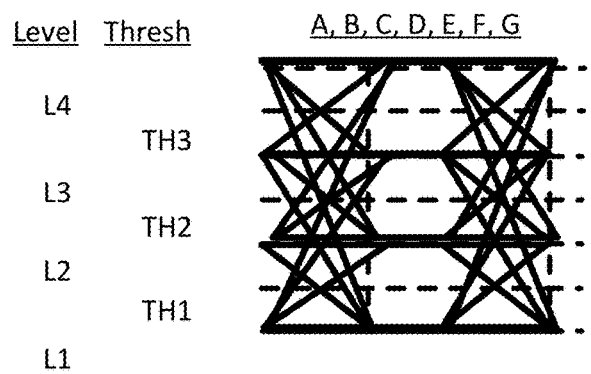

Other overlay diagrams are possible, such as the one illustrated in FIG. 6B, which is generated by combining both previously defined two-level eye components into a single display, i.e., component types D and E of FIG. 2. Further, it is also possible to effectively rebuild the classic eye diagram for a PAM4 signal by including all of the zero-level, one-level, two-level, and three-level subcomponents of the classic eye diagram. In other words, such a combination of an overlay diagram as illustrated in FIG. 6C includes eye component types A, B, C, D, E, F, and G of FIG. 2 that, when combined in a single display, creates an overlay display that is similar or identical in appearance to the classically derived eye diagram for a PAM4 signal. Embodiments of the invention allow the user to define his or her own overlay diagrams by overlaying separated eye component types, either the ones defined above or the components defined by the user.

In addition to a new display generated from separated eye components, as described with reference to FIGS. 2-5, and in addition to overlay diagrams from multiple, separated eye components described with reference to FIGS. 6A, 6B, and 6C, a third type of display may be generated using embodiments of the invention, which may be described as a composite overlay, described with reference to FIGS. 8A-8F.

Figure 8A:
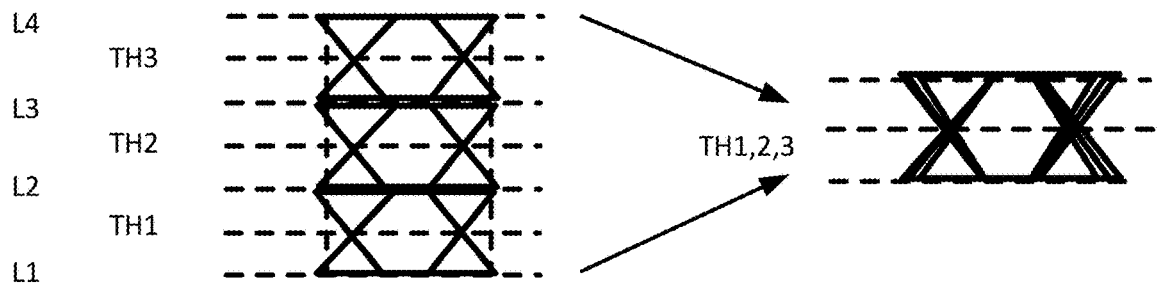
FIGS. 8A, 8B, 8C, 8D, 8E, and 8F are diagrams illustrating potential image layouts of composite eye diagrams made of individual component parts, according to embodiments of the invention.
Figure 9:
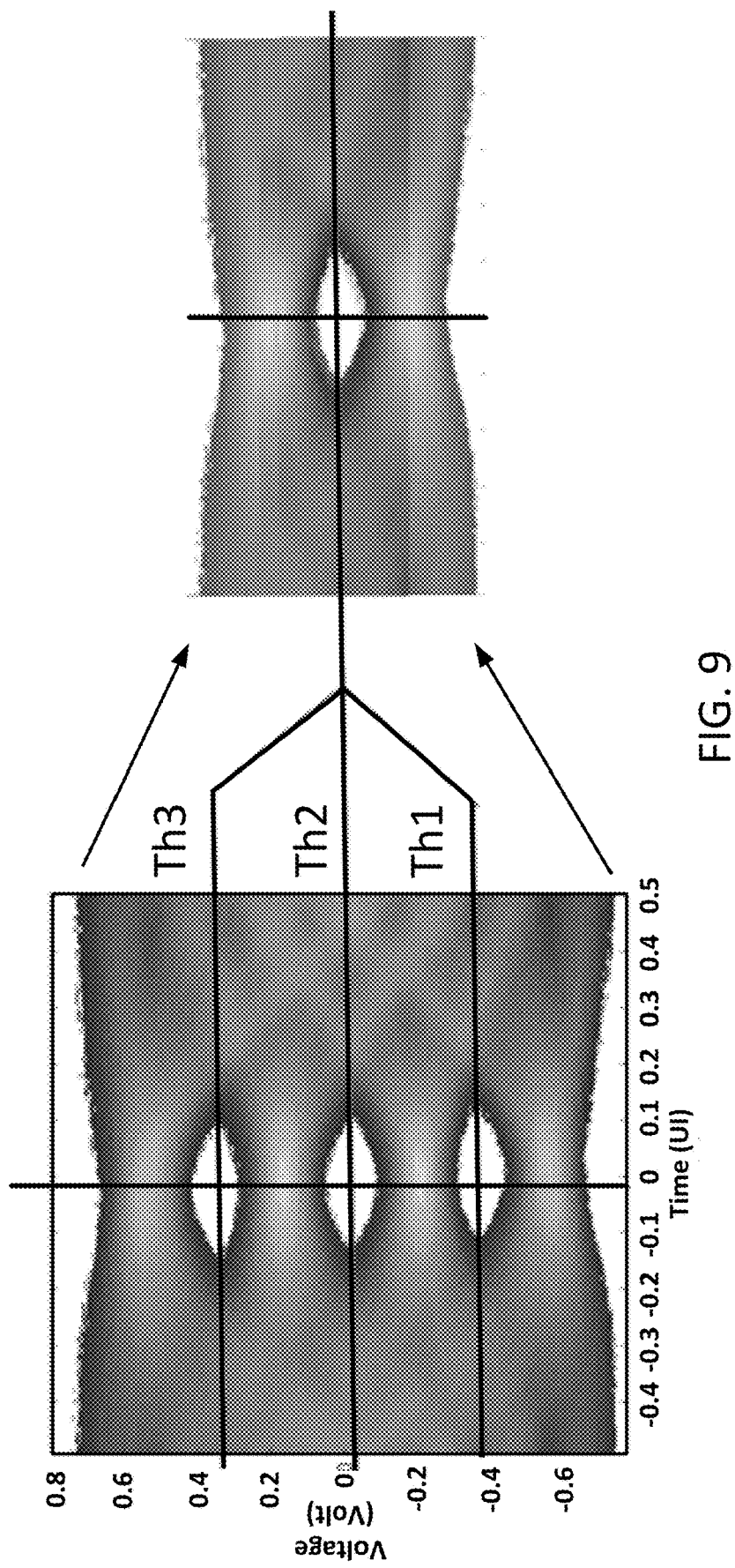
FIG. 9 illustrates how a conventional eye diagram may be collapsed to create a composite eye diagram according to embodiments of the invention.

Composite eye diagrams are generated by effectively re-centering or collapsing multiple threshold levels into a single, composite threshold level. FIG. 8A illustrates how the three, single-level separated eye components A, B, C, each having a different threshold TH1, TH2, TH3, respectively, into a single composite eye diagram having only a single threshold level. FIG. 9 illustrates the same steps of creating the composite overlay diagram of FIG. 8A in an example diagram created from PAM4 data at 53.125 GBaud/s SSPRQ. Note that the end result image of FIG. 9 includes a single eye opening. This composite eye diagram is useful to see the total eye margin from all three eyes combined into one single view. It is also good for using standard NRZ type of analysis on the eye to determine SER. Notice that the total eye opening of the composite view, on the right side of FIG. 9, is smaller than any of the three eye openings in the original, total overlay view on the left side of FIG. 9. This reduction in eye opening size stems from the bottom eye having horizontal offset from the upper two eyes, as well as the shape of the three eyes being different.

Figure 8B:
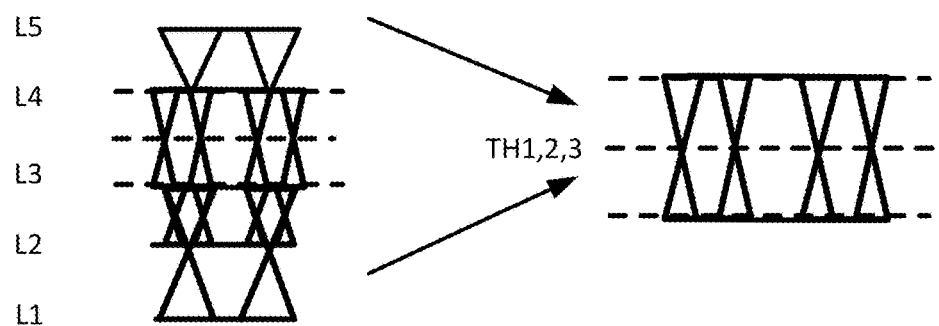
Figure 8C:
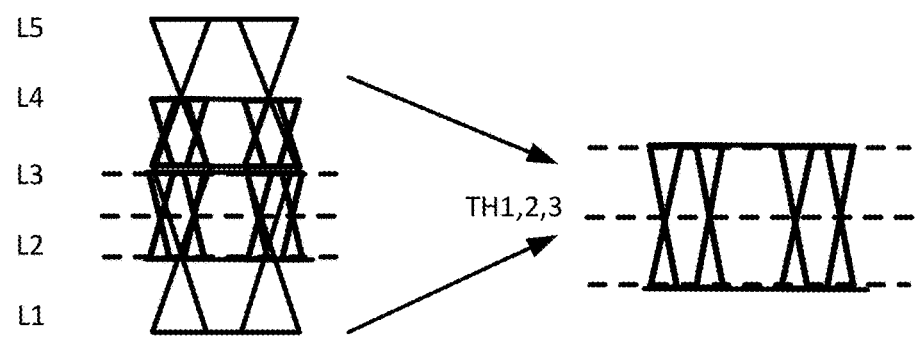
Figure 8D:
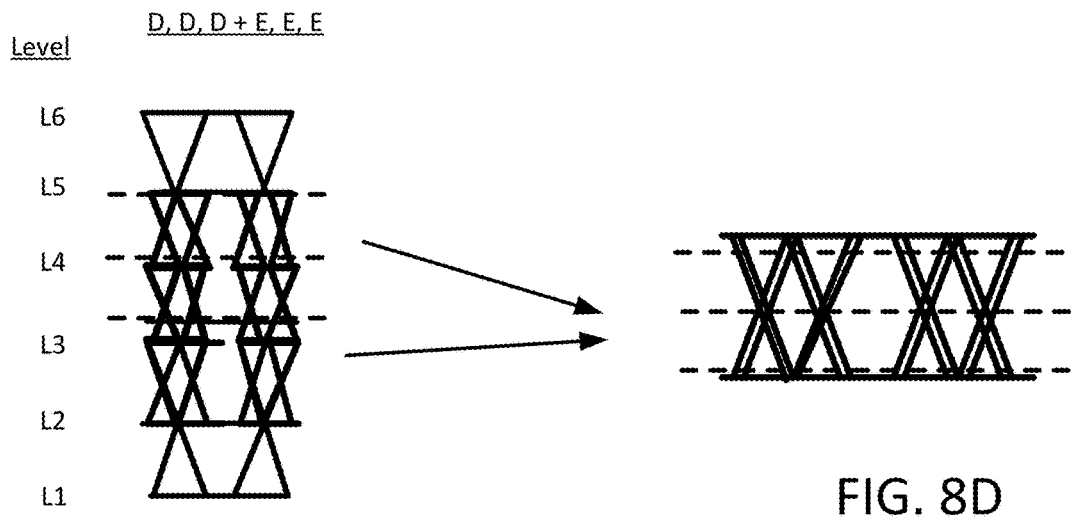
Figure 8E:
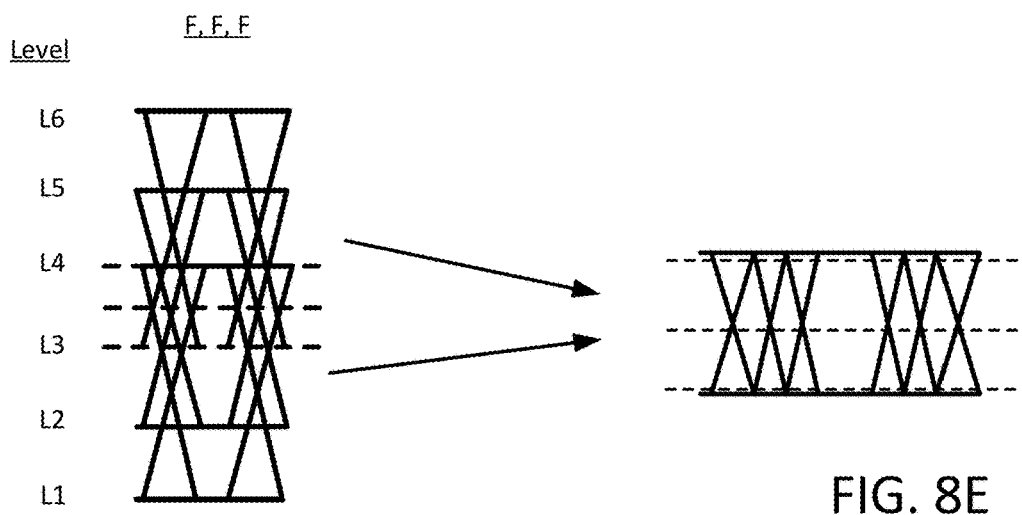
Figure 8F:
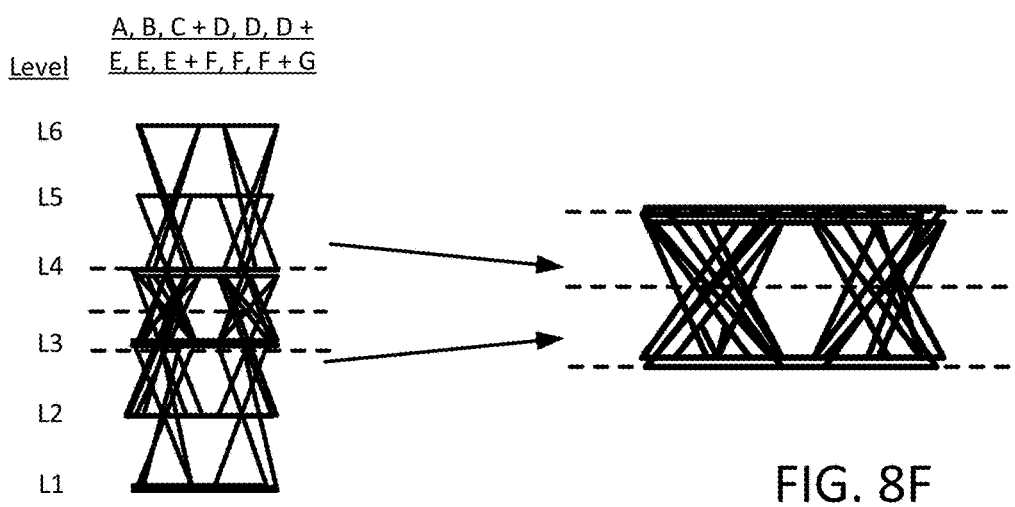

FIG. 8B illustrates a composite image obtained by using only the separate eye component D from FIG. 2. To create the composite image of FIG. 8B, the three threshold levels of all possible separate eye component Ds are combined together to a single threshold. Note that the steeper slope of the two-level transitions results in two edge crossing on each side of the eye as illustrated in FIG. 8B. Similarly, the composite image illustrated in FIG. 8C is created by combining the threshold levels for the separate eye components E combined together to make a single composite eye diagram. The composite image illustrated in FIG. 8D is created by combining all the threshold levels for each separate eye component type D and also combining all thresholds for each separate eye component type E together into a single composite image. The composite image illustrated in FIG. 8E is created by combining all the threshold levels for each separate eye component type F together into a single composite image. This results in three crossings on each side of the resulting composite eye, due to the steep slopes of the input signal transitions during these periods. Finally, FIG. 8F illustrates a total composite image that may be made by making a composite image of all of the separated eyes, i.e., separated eye component types A, B, C, D, E, F, and G, of FIG. 2, all collapsed so that all thresholds are combined into a single threshold level. This unique total composite image includes a single eye opening, just as eye diagrams of PAM2 signals have a single eye opening. This composite diagram of FIG. 8F, with its equivalent single eye opening, allows the user to observe overall SER and jitter as simply as may be observed in a PAM2 eye diagram. Further, the composite diagram of FIG. 8F provides an advantage of being able measure the SER of the PAM4 system using NRZ style algorithms, operations, and histograms. Using this composite image, the decision threshold of each of the three eyes may be adjusted to get the best SER of the overall system, and the adjustable decision thresholds can be included in the process of collapsing eyes.

Although the description of separated eye components, overlaid eye diagrams, and composite eye diagrams was described in reference to PAM4 signals, similar separated eye components, overlaid eye diagrams, and composite eye diagrams may be generated for PAM3 signals using the techniques as described above, and is within the one of skill in the art. The major difference between the two processes is that there are no signal transitions of more than two levels in PAM3, and there are only two threshold levels to combine when making composite eye diagrams.

These new eye diagrams as described above provide improvement in measuring and quantifying properties of input signals. Specific improvements include making better estimations of SER and symbol error ratio, as well as being better able to quantify jitter, noise, and symmetry of the input signal made by the signal transmitter.

Figure 10:
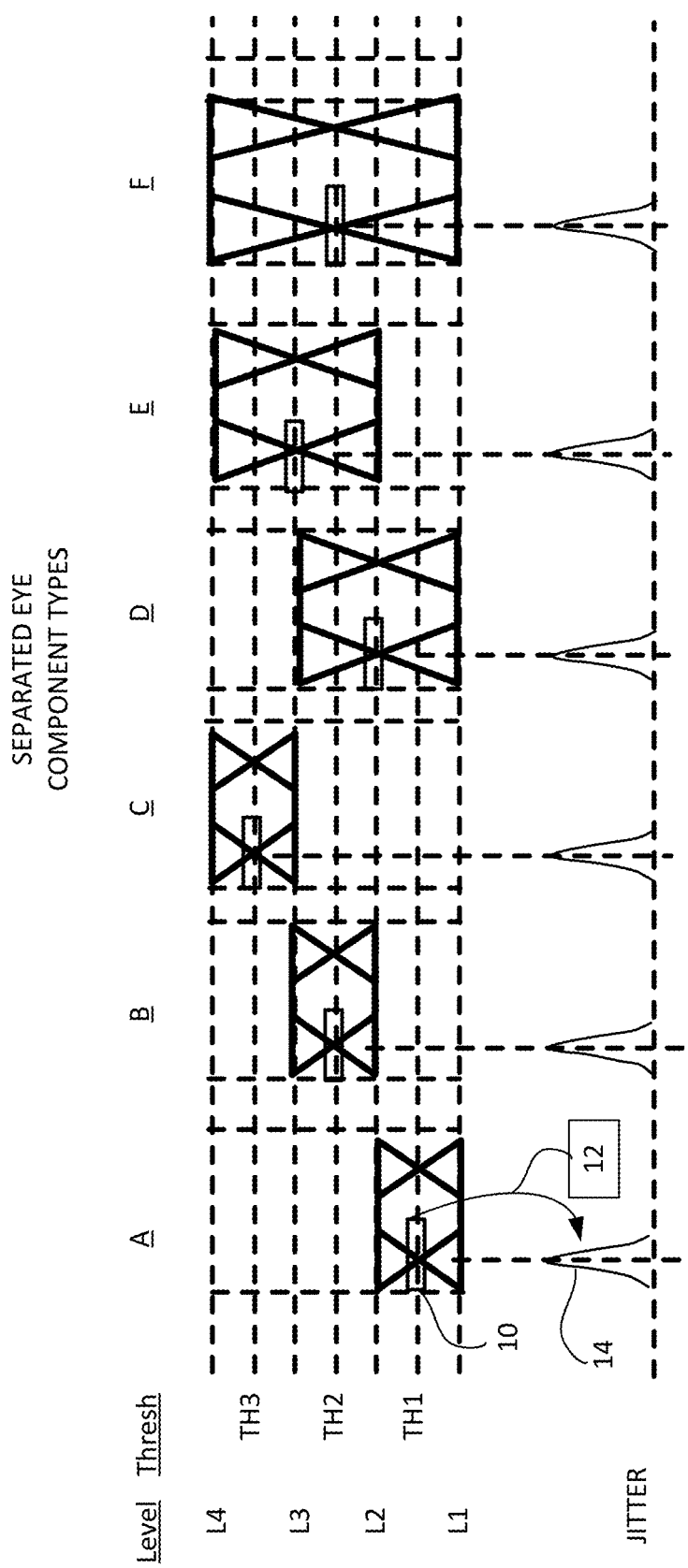
FIG. 10 illustrates how the new diagrams of separated eye components may be used to make jitter measurements on particular segments, or particular transitions of the input signal using embodiments of the invention.

FIG. 10 illustrates how the new diagrams of separated eye components may be used to make jitter measurements on particular segments, or particular transitions of the input signal using embodiments of the invention. Specifically, as illustrated in FIG. 10, a user could create an area of interest 12 on one of the separated eye component diagrams, such as at a first transition 10 in any of the diagrams, as illustrated. Then, the measurement device could generate a jitter plot 14 that displayed the jitter measurement individually, such as for only the highlighted region 12. In this way the user could easily compare jitter for each individual transition edge of the input signal.

Figure 12:
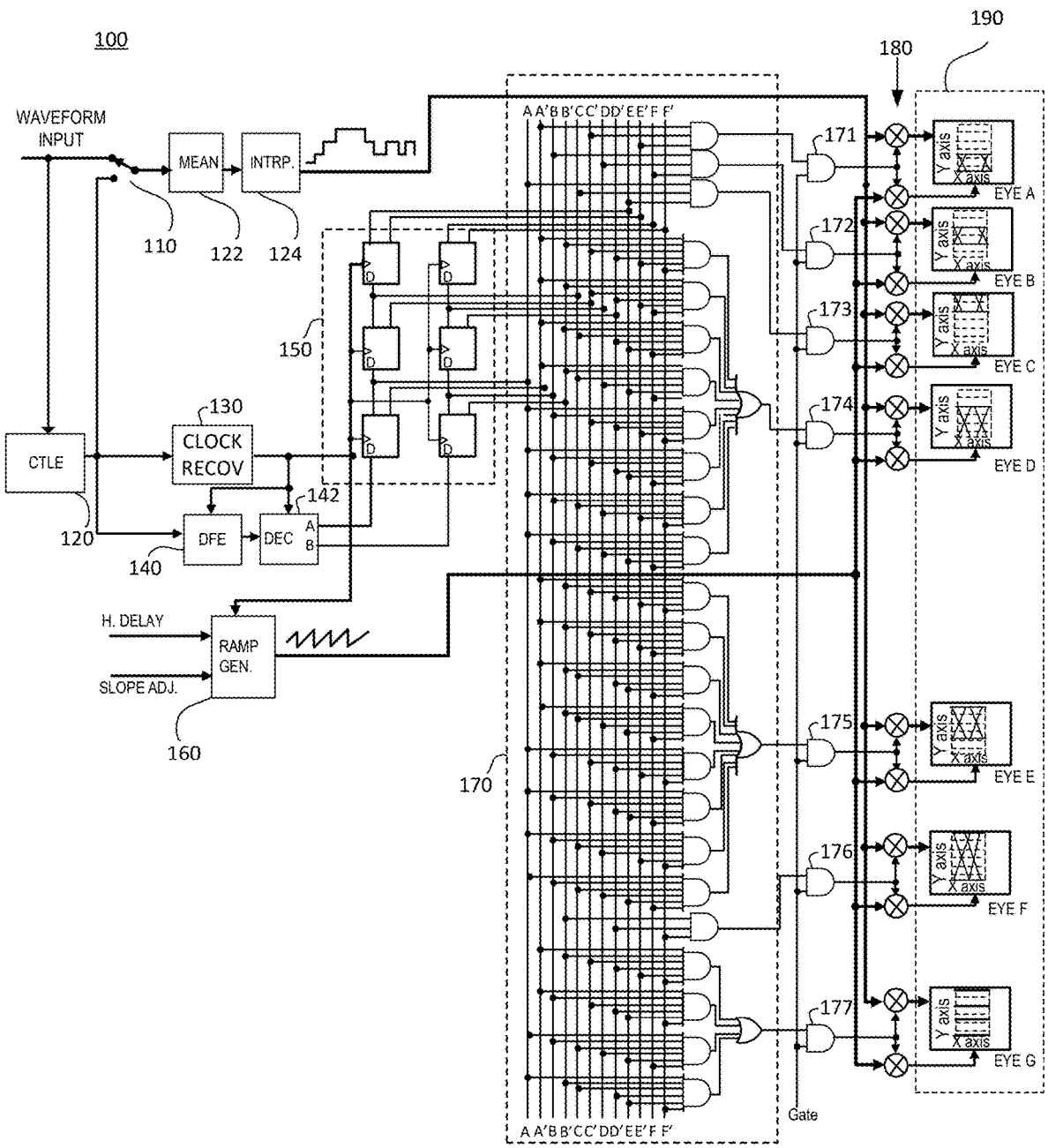
FIG. 12 is a system block diagram of an image generation system according to embodiments of the invention.
Figure 13:
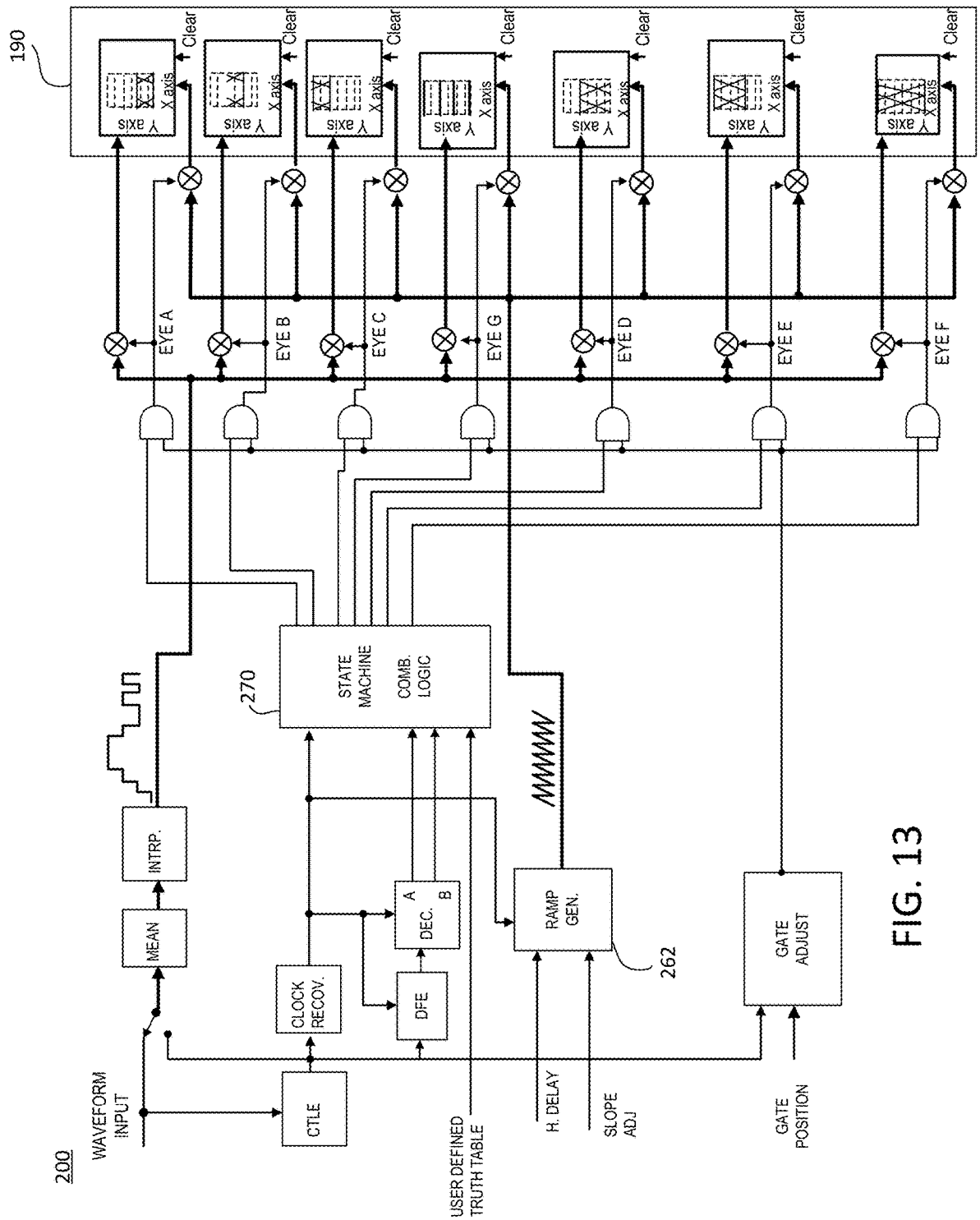
FIG. 13 is a system block diagram of another image generation system according to embodiments of the invention.

FIGS. 11-13 illustrate a system block diagram and a procedure to create the various eye diagram displays in accordance with the disclosed technology. The example embodiment is described as a state machine with combinational logic. Embodiments may be implemented as a hardware circuit, such as in a custom ASIC or FPGA. However, embodiments may also be implemented as operations running on one or more specifically programmed computer processors. In other embodiments the system may be embodied as a combination of hardware and software operations running on one or more processors.

For PAM4 there are two bits of decoded digital data per UI interval. Each UI interval represents a state. Recall from above that there are 64 possible combinations of input signal levels for a two-UI portion of a PAM4 signal. Each of those 64 combinations is illustrated in FIG. 11, represented by six bits of the input signal as it transitions over the two UI period. Recall from above that the input signal may be any one of four levels (00, 01, 11, 10) at three different time periods (beginning, middle, end) of the two-UI period. Therefore, all 64 possibilities of the input signal transitioning over two UIs are accounted for in the six-bit state diagram/truth table of FIG. 11.

As illustrated in FIGS. 12 and 13, a combinational logic circuit controls whether and when to create the diagrams of the particular separated eye components for display on the measurement device. As described below, the combinational logic circuit illustrated in FIG. 12 includes a particular implementation using an array of flip flops and gates, while the combinational logic circuit of FIG. 13 shows that embodiments may be driven by a more general state machine. The systems illustrated in FIGS. 12 and 13 illustrate and represent main components of a system to create the various eye diagram displays in accordance with the disclosed technology. The illustrations of FIGS. 12 and 13, however, are not meant to be complete schematic drawings, and instead these illustrations convey the main concepts of understanding system operation. Various controllable timing circuits, latches, and other controllers may further be included in a complete system, as known by those in the art.

Referring back to the state diagram/truth table of FIG. 11, the three sequential states of the two-bit combinations are used as input data to combinational logic circuits. Each type of separated eye component diagrams can be triggered based on the sequential states of the inputs, i.e., as the digital information from the input signal is changing. In FIG. 11 only the separated eye component diagrams A-G of FIG. 2 are illustrated as outputs, but additional separated eye component diagrams that cover different state transitions, such as those illustrated in FIGS. 3, 4, and 5, as well as other separated eye component diagrams that cover yet different state transitions may be defined by the user using his or her own state diagram/truth table to map when the particular desired transitions in the input signal are made into a diagram.

In FIG. 11, the input variables are the 6 consecutive decoded bits B1, B2, B3, B4, B5, and B6 that cover three UI intervals. In some embodiments, these six bits are stored in D-flip flop pairs, where each pair represents one UI state. For each clock of the state machine, the bit pairs will transfer to the next state pair. In other words, B3 and B4 will clock into B5 and B6, and B1 and B2 clock into B3 and B4, and the next state of the data stream clocks into B1 and B2. The truth table shown in FIG. 11 includes inputs of B1, B2, B3, B4, B5, and B6, and output columns are the separated eye component diagrams A-G. This means that certain combinations of the input states cause one, or more, of the separated eye component diagrams A-G to be generated for that particular state combination. The output variables are used to control a gate of the input data waveform to a database eye diagram Y axis, and to also control a gate of a ramp, or timing, signal to the X-axis. Together, the input waveform and the ramp signal combine to create the particular separated eye component diagrams A-G.

In general, creating a state table such as described in FIG. 11 provides the user with the flexibility of selecting the particular separated eye component diagrams that the user desires to view. The user may control how and which diagrams are generated by making appropriate entries into the truth table. Or, some embodiments may allow the user to select particular separated eye component diagrams from a menu presented to the user, and the system itself produces the eye diagrams, or the Boolean equations derived from the truth table.

Boolean expressions may be derived from the truth table of FIG. 11 by using Karnaugh maps or other methods. The Boolean expressions of FIG. 11 are illustrated in Table 2, which associates particular separated eye component diagrams with their triggering inputs.

TABLE 2

| Eye Component Diagram Type | Boolean equations |
| --- | --- |
| A | B1' B3' B5' |
| B | B2 B4 B6 |
| C | B1 B3 B5 |

TABLE 2-continued

| Eye Component Diagram Type | Boolean equations |
|---|---|
| D | B1' B2' B3' B4' B5' B6' + |
|   | B1' B2' B3' B4' B5 B6 + |
|   | B1' B2' B3 B4 B5' B6' + |
|   | B1' B2' B3 B4 B5 B6 + |
|   | B1 B2 B3' B4' B5' B6' + |
|   | B1 B2 B3' B4' B5 B6 + |
|   | B1 B2 B3 B4 B5' B6' + |
|   | B1 B2 B3 B4 B5 B6 |
| E | B1' B2 B3' B4 B5' B6 + |
|   | B1' B2 B3 B4 B5 B6' + |
|   | B1' B2 B3 B4' B5' B6 + |
|   | B1' B2 B3 B4' B5 B6' + |
|   | B1 B2' B3' B4 B5' B6 + |
|   | B1 B2' B3' B4 B5 B6' + |
|   | B1 B2' B3 B4' B5' B6 + |
|   | B1 B2' B3 B4' B5 B6' |
| F | B2' B4' B6' |
| G | B1' B2' B3' B4' B5' B6' + |
|   | B1' B2 B3' B4' B5 B6' + |
|   | B1 B2 B3 B4 B5 B6 + |
|   | B1 B2' B3 B4' B5 B6' |

An example embodiment system block diagram for creating seven separated eye views using the state/truth table of FIG. 11 is illustrated in FIG. 12. Although, for simplicity, this block diagram of FIG. 12 does not include any of the overlaid or composite eye diagrams, these can be implemented using the same design process as described above for creating the separated eye component diagrams A-G of FIG. 2. In other embodiments, additional algorithm blocks can be added where the separated eye diagram data bases are inputs, and the outputs are the result of them combined in different ways. As mentioned above, combinational logic may be inserted to create dynamic eye triggers and/or create other types of eye views based on combinations of the separated eye component diagrams.

The image generation system 100 includes various components to create the separated eye component diagrams as described above. A source switch 110 allows the user to view the input waveform that has either been filtered through one or more filters 120, or view the original input waveform in the various eye diagrams selected by the user. The filters 120 may include a de-embed filter and/or a CTLE (Continuous Time Linear Equalization) filter. These filters are generally used as part of a clock recovery process, especially when the ISI (Intersymbol Interference) is relatively high. These filters 120, when used, may have the effect of opening the eye portion of the eye diagram to make it easier to decode.

Further components of the image generation system 100 may include a function 122 that optionally subtracts a mean or average of the input signal, such as a PAM4 signal from the input waveform so that only the deviations are viewed in the final images. This may be a useful tool for investigating input anomalies. An interpolator 124 may also be optionally invoked. The interpolator adds additional, interpolated, data points to the input waveform, and may be beneficial to use, especially when the symbol rate is synchronized or close to being synchronized to the clock, or when the record length is relatively short.

A clock recovery system 130 may also be present in the image generation system 100, which is used to generate or recover a clock signal from the input waveform. In other embodiments a clock signal may be a separate input to the image generation system 100. A decision feedback equalizer 140 is used to remove ISI, and may also be used to recover signal levels from the input waveform that will be provided to a decoder 142. The decoder 142 determines which bits, or levels, to assign to the signal level for each UI interval. The decoder 142 may use binary code or Gray code, for example.

A group 150 of flip flops are used to store the states of the decoded input signal as they progress through the two-UI interval of the diagrams. As illustrated, the two output bits for each state from the decoder are stored in the sequence of flip flop state pairs. In this system 100 there are three states represented by six flip flops in the group 150. There can be as many states as desired. Different combinational logic would be created if there were a different number of states. Each time the flip flops are clocked, a new state is input and all the other states move down the line to the next flip flop pair in the group 150.

A ramp generator 160 creates a linear ramp component for the x-axis of the eye diagrams that is eventually used together with the input signal to produce the various separated eye component diagram. In general, the ramp signal from the ramp generator 160 cover two UI intervals, including ½ of the previous state UI, the full current UI state, and ½ of the subsequent UI state. The ramp generator 160 may include a clock delay input for tuning the ramp with respect to the input data. The ramp generator 160 may also include a ramp slope control to adjust the steepness of the ramp signal. This ramp slope control allows the user to bring more or fewer UI intervals into the eye of the various diagrams produced. Although FIGS. 12 and 13 illustrate using a ramp generator 160 to provide the horizontal timing information for the generated diagrams, other embodiments may use any known circuits or techniques to produce the timing information.

Combinational logic 170 was created from the state/truth table of FIG. 11. In general this logic 170 implements the simplified Boolean equations from the truth table that define which kinds of transition sequences go into any eye view. If the truth table of FIG. 11 were changed, then the combinational logic 170 would also change to implement the changed truth table. The output of the combinational logic is the output from a set of output gates 171-177, which controls when the various eye diagrams are generated. The output from the set of output gates 171-177 is passed to a set of multiplier or mixer gates 180, which may be thought of as analog gates. The input waveform is applied to all of the first pair of multiplier gates 180 for each type of eye diagram, while the output of the ramp generator 160 is applied to all of the second pair of multiplier gates for each type of eye diagram. The individual output gates 171-177 of the combination logic 170 can be 1 or 0 at any time. When the output is 1, the input signal passes through its multiplier gate 180, and is combined with the ramp of the ramp generator 160 to an image database 190 for the display. Instead, when the logic output of the individual output gates 171-177 is 0, the input signal is multiplied in its multiplier gate 180 times the gate signal to get 0, and is not passed to the image database.

The image database 190 stores a database of the horizontal, vertical, and histogram data for each of the separated eye component diagrams while operating the image generation system 100. Then, a user may select one or more of the individual images within the image database 190 to create an image for export to a display device. Further, when the image generation system 100 is used in a machine learning context, the image database 190, or other data output from the image generation system, is stored in a tensor array of images. Each image instance contains a database representation of counters, where each counter is one bit of the image. Each image contains a different bit sequence of the waveform as a function of time. Each occurrence of the same waveform sequence in the full record length of the waveform is a component of the image, and all of the occurrences go to make up a single image. The resulting tensor may be used as input to a machine learning process, as described below.

FIG. 13 illustrates another image generation system 200 used to generate the various eye images described above. In general, the image generation system 200 operates the same or similar to the image generation system 100 described with reference to FIG. 12, and the description of the same or similar functions or components will not be repeated. The main difference between the image generation systems 100, 200, is that the system 200 includes generalized state machine logic 270 in place of the combinational logic 170 of FIG. 12. The state machine logic 270 may be implemented by a programmed system, such as software operating on one or more processors. The function of the state machine logic 270 is the same as the combinational logic 170, which is to control what data from the input signal appears in the individual XYZ data of the separated eye component diagrams that make up the image database 190.

Additionally present in the image generation system 200 is a gate control 262, which controls the total length or gated region of an input waveform to be allowed into the data that generates the image database 190. This gate control may be used to implement a region of inspection that the user creates with one or more cursors on a display of a test and measurement instrument, such as an oscilloscope. Then, only waveform data that is within the region (or outside the region, depending on the selection) is included into the particular image database. In other embodiments a detection process may automatically determine the boundaries of the gates used by the gate control 262. A gate control system could also be added to the image generation system 100 of FIG. 12.

Embodiments of the invention may also use the new forms of eye class images to tune a transmitter, such as a PAM4 transmitter, using machine learning, as described with reference to FIGS. 14-16. Using machine learning may speed the manufacturing process for tuning a transmitter, which is presently a cumbersome process in some instances.

Figure 14:
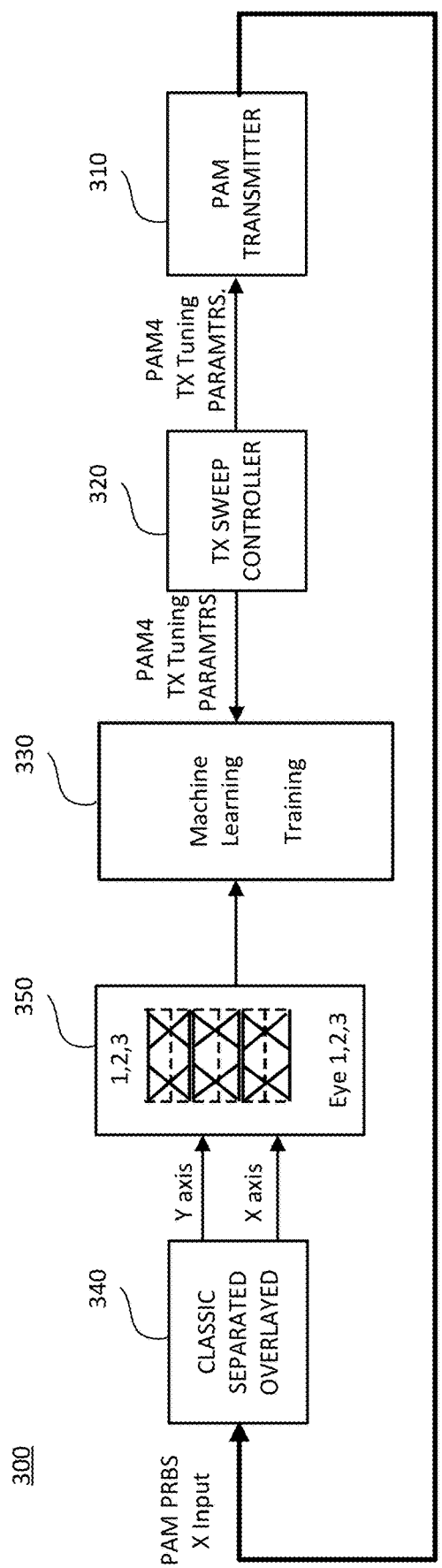
FIG. 14 is a process diagram illustrating an example machine learning training system for transmitters according to embodiments of the invention.
Figure 15:
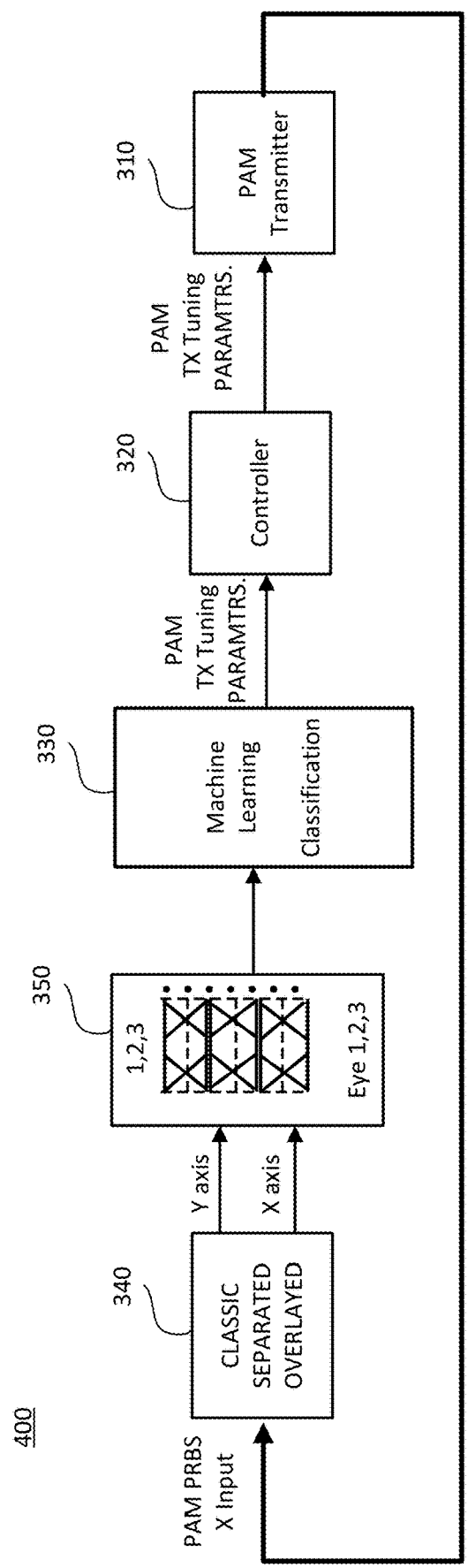
FIG. 15 is a process diagram illustrating an example machine learning tuning system using the trained system of FIG. 14, according to embodiments.

FIG. 14 illustrates a process 300 of training a neural network for use in transmitter tuning. An initial step in the training process 300 is illustrated as sweep operation 320, where a controller sweeps the gain and delay settings of a transmitter 310, and loads each tuning set into a machine learning neural network 330 as well as loading the transmitter 310 with the parameters. The transmitter 310 outputs signals based on the loaded parameters, and those signals are input to an image generation system 340, which generates a set of images 350 from the transmitter 310 output. Then, the neural network 330 can be trained to associate tuning parameters with the images 350 generated from the transmitter 310 output. The images 350 may include one or more of the separated eye diagrams described above, and specifically may include the overlaid diagram illustrated in FIGS. 6A and 7B. This particular overlaid eye diagram simplifies and reduces the data in the eye, which is one of the first steps in setting up machine learning. This simplified data makes the resulting image more suitable for use with machine learning algorithms to identify and specify how to tune the transmitter parameters. Thus, this comparing the simplified eye diagram in conjunction with the swept transmitter data trains the neural network 330 to classify which of the gain and delay settings of the transmitter 310 correspond to conforming outputs of the transmitter. In other embodiments, the tensor array, described above, may be used in place of the eye diagrams 350 for training the neural network in the machine learning 330. In yet another embodiment, individual images of a single two UI sequence of a waveform are used as inputs to the neural network 330 for training the neural network.

After training, such as with the process 300, a tuning process 400 may be used to tune one or more transmitters as illustrated with reference to FIG. 15. This tuning process 400 may be used to tune the transmitters while on the assembly line, for example. In a first operation of the tuning process 400, the transmitter 310 generates a signal that is converted by the image generation system 340 into the eye diagram 350, described in the process 300, which is then fed to the machine learning block 330, which is now operating in a regression mode. Recall that, in the training process 300, the controller 320 set up the transmitter parameters into the transmitter 310. Now, in the tuning process 400, a new set of transmitter parameters is determined by the machine learning block 330, and the new parameters are passed to the transmitter 310 by a controller 320, which updates to the new parameters.

In a special tuning process for optical transmitters, the eye diagrams 350 are not used, and instead an array of logic gates and combination logic may be replicated 64 times, representing the 64 possible symbol sequences for a three-state PAM4 signal, described above. In other embodiments, more states may be specified, in which case the logic gates and combination logic is expanded to match the number of states. Then, a long record waveform is received and applied to the array of logic gates to create the individual images. These images may be stored in a single tensor array of images, and input to the machine learning neural network 330. Alternatively, the 64 images created in this process may each be singularly input to 64 individual neural networks, and the output of the 64 neural networks combined as input into another, single, neural network.

Figure 16:
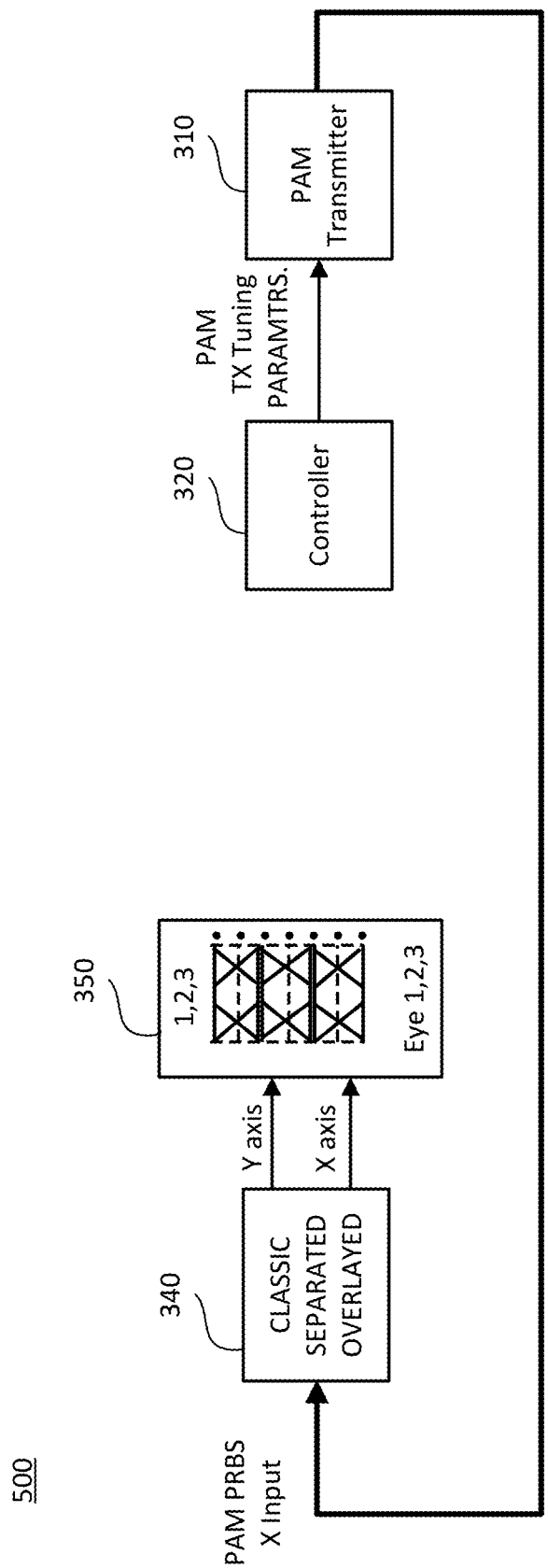
FIG. 16 is a process diagram illustrating an example transmitter testing system using the trained system of FIG. 14, according to embodiments.

After the transmitter is calibrated in the tuning process 400, additional testing, such as on a manufacturing line, may be performed using the testing system 500 illustrated in FIG. 16. Note that in the testing system 500, the machine learning block 330 is no longer necessary.

The system described above for generating and then using new simplified images created from one or more separated eye component types is very useful for test and measurement systems. Some areas that may particularly benefit are: PAM4 transmitter tuning, PAM3 USB4 applications, PCIE gen. 6, PAM4 DDR6, creating simplified images for PAMn, where n>2, PAMn eye triggers using a user defined eye, classic eye classes for automated analysis; data reduction for machine learning applications, and manual/human debugging views.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

EXAMPLES

Illustrative examples of the disclosed technologies are provided below. An embodiment of the technologies may include one or more, and any combination of, the examples described below.

Example 1 is a system for generating images on a test and measurement device, including a first input for accepting a waveform input signal carrying sequential digital information, and an image generator structured to generate a visual image using a segment of the waveform input only when two or more sequential codes of digital information match sequential codes carried in the sequential digital information of the segment of the waveform input.

Example 2 is a system for generating images in accordance with Example 1, further comprising a second input for accepting the two or more sequential codes of digital information.

Example 3 is a system for generating images in accordance with any of the above Examples, in which the image generator is structured to disregard the waveform input signal when the two or more sequential codes of digital information do not match sequential codes carried in the sequential digital information of the waveform input.

Example 4 is a system for generating images in accordance with any of the above Examples, in which the sequential codes of digital information comprise three codes, and in which the segment of the waveform input carries three instances of digital information.

Example 5 is a system for generating images in accordance with any of the above Examples, in which the waveform input signal is a PAMn signal, with n>2.

Example 6 is a system for generating images in accordance with any of the above Examples, in which the image generator is structured to generate at least two visual images, in which a different sequential code of the two or more sequential codes of digital information is used for each of the at least two visual images.

Example 7 is a system for generating images in accordance with any of the above Examples, in which the waveform input signal has a unit interval, and in which the visual image has a horizontal axis equal to two unit intervals of the waveform input signal.

Example 8 is a system for generating images in accordance with any of the above Examples, further comprising a comparator coupled to the image generator and structured to determine when the two or more sequential codes of digital information match sequential codes carried in the sequential digital information of the waveform input.

Example 9 is a system for generating images in accordance with Example 8, in which the comparator comprises combinational logic circuits or in which the comparator comprises a programmed state machine.

Example 10 is a system for generating images in accordance with Example 9, in which the comparator comprises combinational logic circuits defined by a user.

Example 11 is a system for generating images in accordance with any of the above Examples, in which the image generator is further structured to create a tensor array of images.

Example 12 is a method for generating images on a test and measurement device, including accepting a waveform input signal carrying sequential digital information, and generating a visual image using a segment of the waveform input only when two or more sequential codes of digital information match sequential codes carried in the sequential digital information of the segment of the waveform input.

Example 13 is a method according to Example 12, further comprising accepting the two or more sequential codes of digital information.

Example 14 is a method according to any of the above Example methods, in which the image generator disregards the waveform input signal when the two or more sequential codes of digital information does not match sequential codes carried in the sequential digital information of the waveform input.

Example 15 is a method according to any of the above Example methods, in which the sequential codes of digital information comprise three codes, and in which the segment of the waveform input carries three instances of digital information.

Example 16 is a method according to any of the above Example methods, in which the waveform input signal is a PAMn signal, with n>2.

Example 17 is a method according to any of the above example methods, in which determining when the two or more sequential codes of digital information match sequential codes carried in the sequential digital information of the segment of the waveform input is performed by a user-defined state machine.

Example 18 is a method according to any of the above example methods, further comprising generating a tensor array of images.

Example 19 is a method according to any of the above example methods, further comprising providing the tensor array of images to a machine learning network.

Example 20 is a method according to any of the above example methods, further comprising generating at least two visual images, in which a different sequential code of the two or more sequential codes of digital information is used for each of the at least two visual images.

Although specific aspects of the disclosure have been illustrated and described for purposes of illustration, it will be understood that various modifications may be made without departing from the spirit and scope of the disclosure. Accordingly, the disclosure should not be limited except as by the appended claims.

We claim:

1. A system for generating images on a test and measurement device, comprising:
   a first input for accepting a waveform input signal carrying sequential digital information; and
   an image generator structured to generate a visual image using a segment of the waveform input only when two or more sequential codes of digital information match sequential codes carried in the sequential digital information of the segment of the waveform input, in which the sequential codes of digital information comprise three codes, and in which the segment of the waveform input carries three instances of digital information.

2. The system for generating images according to claim 1, further comprising a second input for accepting the two or more sequential codes of digital information.

3. The system for generating images according to claim 1, in which the image generator is structured to disregard the waveform input signal when the two or more sequential codes of digital information do not match sequential codes carried in the sequential digital information of the waveform input.

4. The system for generating images according to claim 1, in which the waveform input signal is a PAMn signal, with n>2.

5. The system for generating images according to claim 1, in which the image generator is structured to generate at least two visual images, in which a different sequential code of the two or more sequential codes of digital information is used for each of the at least two visual images.

6. The system for generating images according to claim 1, in which the waveform input signal has a unit interval, and in which the visual image has a horizontal axis equal to two unit intervals of the waveform input signal.

7. A system for generating images on a test and measurement device, comprising:
   a first input for accepting a waveform input signal carrying sequential digital information;
   an image generator structured to generate a visual image using a segment of the waveform input only when two or more sequential codes of digital information match sequential codes carried in the sequential digital information of the segment of the waveform input; and
   a comparator coupled to the image generator and structured to determine when the two or more sequential codes of digital information match sequential codes carried in the sequential digital information of the waveform input.

8. The system for generating images according to claim 7, in which the comparator comprises combinational logic circuits or in which the comparator comprises a programmed state machine.

9. The system for generating images according to claim 8, in which the comparator comprises combinational logic circuits defined by a user.

10. The system for generating images according to claim 7, in which the image generator is further structured to create a tensor array of images.

11. A method for generating images on a test and measurement device, comprising:
    accepting a waveform input signal carrying sequential digital information; and
    generating a visual image using a segment of the waveform input only when two or more sequential codes of digital information match sequential codes carried in the sequential digital information of the segment of the waveform input, in which the sequential codes of digital information comprise three codes, and in which the segment of the waveform input carries three instances of digital information.

12. The method for generating images according to claim 11, further comprising accepting the two or more subset of the sequential codes of digital information.

13. The method for generating images according to claim 11, in which the image generator disregards the waveform input signal when the two or more sequential codes of digital information does not match sequential codes carried in the sequential digital information of the waveform input.

14. The method for generating images according to claim 11, in which the waveform input signal is a PAMn signal, with n>2.

15. The method for generating images according to claim 11, further comprising generating at least two visual images, in which a different sequential code of the two or more sequential codes of digital information is used for each of the at least two visual images.

16. A method for generating images on a test and measurement device, comprising:
    accepting a waveform input signal carrying sequential digital information; and
    generating a visual image using a segment of the waveform input only when two or more sequential codes of digital information match sequential codes carried in the sequential digital information of the segment of the waveform input, in which determining when the two or more sequential codes of digital information match sequential codes carried in the sequential digital information of the segment of the waveform input is performed by a user-defined state machine.

17. The method for generating images according to claim 16, further comprising generating a tensor array of images.

18. The method for generating images according to claim 16, further comprising providing the tensor array of images to a machine learning network.

* * * * *